US007062354B2

(12) United States Patent
Ganot et al.

(10) Patent No.: US 7,062,354 B2
(45) Date of Patent: Jun. 13, 2006

(54) MULTI-LAYER PRINTED CIRCUIT BOARD FABRICATION SYSTEM AND METHOD

(75) Inventors: Amnot Ganot, Petach Tikya (IL); Hanan Gino, Rishon Lezion (IL); Golan Hanina, Rishon Lezion (IL); Zeev Kantor, Gan Yavne (IL); Boris Kling, Rehovot (IL); Shabtay Spinzi, Tel Mond (IL); Barry Ben-Ezra, Ramat Hasharon (IL)

(73) Assignee: Orbotech Ltd., Yavne (IL)

( * ) Notice: Subject to any disclaimer, the term of this patent is extended or adjusted under 35 U.S.C. 154(b) by 247 days.

(21) Appl. No.: 10/416,202

(22) PCT Filed: Nov. 6, 2001

(86) PCT No.: PCT/IL01/01027

§ 371 (c)(1),
(2), (4) Date: Sep. 12, 2003

(87) PCT Pub. No.: WO02/39793

PCT Pub. Date: May 16, 2002

(65) Prior Publication Data

US 2004/0081351 A1    Apr. 29, 2004

Related U.S. Application Data

(63) Continuation-in-part of application No. 09/708,160, filed on Nov. 8, 2000, now Pat. No. 6,819,789, and a continuation of application No. 09/792,498, filed on Feb. 23, 2001, now Pat. No. 6,701,197.

(30) Foreign Application Priority Data

Apr. 1, 2001    (IL)    ..................... 142354

(51) Int. Cl.
    *G06F 19/00* (2006.01)
(52) U.S. Cl. ...................... 700/192; 382/145; 382/294; 348/87; 438/7
(58) Field of Classification Search .................. 700/62, 700/64, 166, 192, 194; 382/145, 151, 287, 382/291, 294, 302; 250/559.34; 356/237.4, 356/237.5; 348/87, 126; 438/7, 16; 702/159
    See application file for complete search history.

(56) References Cited

U.S. PATENT DOCUMENTS 5,170,058 A * 12/1992 Berasi et al. ............... 250/548

(Continued)

FOREIGN PATENT DOCUMENTS

| WO | WO 94/09989 | 5/1994 |
| WO | WO 00/02424 | 1/2000 |
| WO | WO 02/3979 | 5/2002 |

OTHER PUBLICATIONS

T. Sandstrom et al., "Highly accurate pattern generation using acousto-optical deflection", SPIE vol. 1463, Optical/Laser Microlithography, , pp. 629-637, 1991.

(Continued)

*Primary Examiner*—Leo Picard
*Assistant Examiner*—Chad Rapp
(74) *Attorney, Agent, or Firm*—Sughrue Mion, PLLC

(57) ABSTRACT

A method for aligning an image to be recorded by a direct image scanner on an upper layer of a printed circuit board with an image recorded on a lower layer thereof, the method comprising visually imaging a portion of the image on the lower layer and recording a pattern on the upper layer, referenced to coordinates of the visual image of the portion.

28 Claims, 17 Drawing Sheets

U.S. PATENT DOCUMENTS

| | | | |
|---|---|---|---|
| 5,386,221 A | | 1/1995 | Allen et al. |
| 5,388,515 A | | 2/1995 | Schneider et al. |
| 5,388,517 A | * | 2/1995 | Levien ................ 101/485 |
| 5,548,372 A | | 8/1996 | Schroeder et al. |
| 5,643,699 A | | 7/1997 | Walder |
| 6,037,967 A | | 3/2000 | Allen et al. |
| 6,165,658 A | * | 12/2000 | Taff et al. ................ 430/30 |
| 6,205,364 B1 | | 3/2001 | Lichtenstein et al. |
| 6,567,713 B1 | | 5/2003 | Lichtenstein et al. |

OTHER PUBLICATIONS

D. Maydan, "Micromachining and image recording on thin films by laser beams", Bell System Technical Journal, vol. 50, No. 6, Jul-Aug., 1971, USA.

H. Ulrich et al., "Direct Writing Laser Lithography for Production of Microstructures", Microelectronic Engineering 6, (1987), pp. 77-84.

* cited by examiner

MULTI-LAYER PRINTED CIRCUIT BOARD FABRICATION SYSTEM AND METHOD

This application is a §371 National Stage Entry of PCT/IL01/01027 filed on Nov. 6, 2001; PCT/IL01/01027 is a continuation in part of U.S. application Ser. No. 09/708,160 filed Nov. 8, 2000 (now U.S. Pat. No. 6,819,789); PCT/IL01/01027 is a continuation of U.S. application Ser. No. 09/792,498 filed Feb. 23, 2001 (now U.S. Pat. No. 6,701,197); PCT/IL01/01027 claims priority also from Israel Application 142354 filed Apr. 1, 2001.

FIELD OF THE INVENTION

The present invention is related to the field of electrical circuit fabrication and especially to the field of printed circuit board fabrication employing a laser direct imaging device.

BACKGROUND OF THE INVENTION

It is known to manufacture printed circuit boards by way of a so-called sequentially build up methodology in which at least one outer layer is sequentially added to an already existing printed circuit board core.

Systems for recording electrical circuit patterns on printed circuit board substrates include exposure systems employing projectors and phototool type mask having an image of an electrical circuit formed onto a transparent film.

PCT patent publication WO 00/02424, the disclosure of which is incorporated herein by reference, describes a scanning laser direct imaging (LDI) system for writing an electric circuit pattern on a printed circuit board substrate.

FIG. 1 is a reproduction of FIG. 1 of the above referenced publication. Some details of its operation are given below. Further details of the operation and an explanation of the figure can be found in the publication. In such systems, a laser beam or beams, modulated with pattern data, is scanned across a sensitized printed circuit board substrate 78 to write a latent image of a desired electrical circuit pattern. The substrate is optionally inverted and a second pattern in side to side alignment with the first pattern is written on the other side of the substrate. In accordance with some printed circuit board fabrication techniques, substrate layers may be sequentially laminated to previously produced substrate layers and an electrical circuit pattern is written on the outermost side of each sequentially added layer in a build up fashion. The latent patterns are developed to form etching masks on the substrate. The masked substrate is etched to form the desired electrical circuit pattern.

Among the problems which arise in printed circuit board fabrication is the side to side alignment of printed circuit patterns on various substrate layers, and mutual alignment among patterns printed on various substrate layers. One method utilized to obtain suitable alignment is disclosed in the embodiment of FIGS. 1, 2, 14, 15 and 16, of the publication (FIG. 2 is a reproduction of FIG. 14 of the above referenced publication.). PC board substrate 78 is formed with a plurality of holes 150 at least some of which are preferably aligned, at least roughly, in the scan direction. A base on which the substrate is mounted is formed with openings larger than the holes in the substrate and the holes in the substrate are positioned generally in correspondence to the openings in the base. One or more detectors 152 are positioned below the scan line of the scanner.

As the printed circuit board is transported past the scan line, the scanner scans across the holes in a substrate layer. Based on signals detected by detector 150 via the holes and the openings, the locations of the holes in the substrate layer with respect to the scanner are detected. The base is optionally rotated and scanning of the printed circuit board substrate then commences with the position of the scanning lines pattern being referenced to the location of the holes.

It should be noted that the position of the scanning beam that passes through holes 150 is scanned together with another beam that impinges a scale 80 that is used to determine the true instantaneous (scan dimension) position of the beam in the scan direction. Furthermore, the relative cross-scan position of the holes (and thus the board) is determined utilizing a second scale, typically operatively associated with the base.

When scanning the second side of the substrate, the procedure is repeated to determine the position of the holes and thus the position of the already scanned pattern on the first side of the substrate (or the position of already scanned patterns on lower layers in a build up board) with respect to the coordinate space of the LDI system. This allows for the data in the scanning of each subsequent side to be aligned with respect to previously scanned sides.

Optionally, an additional series of holes in the board and pins on the base, or a guide rail along the base, may be used for rough alignment of the substrate. Such pins are shown in FIG. 16 of the reference. In some conventional systems, only such mechanical means are used for aligning the patterns on the two sides of the substrate. The system may include means for rotating the board to improve alignment.

Measuring systems employing imagers, and especially CCD cameras, are known in the art for use in determining the positioning of a PC board in an LDI scanner. Generally, such cameras may be used to detect various markings on a printed circuit board laminate layer, or to detect an edge of a printed circuit board laminate layer and to relate the detected position of the marking or the edge with a scanner position.

SUMMARY OF THE INVENTION

An aspect of some embodiments of the invention is concerned with methods of aligning to be written on a subsequent sequentially added layer (hereinafter the upper layer) which is overlaid on a PC board core ("the lower layer") to images already written thereon.

In general, in sequential build-up an electrical circuit pattern is first created by conventional means in the lower layer and then an upper layer is added. The upper layer contains a first dielectric material, and a superimposed second layer of conducting material. Holes are created in the upper layer so as to enable creation of electrically conductive paths between the upper and lower layers the conducting material is coated, temporarily with a photoresist layer. The scanner then writes a pattern on the photoresist aligned with the previously created pattern on the lower layer. The photoresist is developed and the conductive material is etched, to providee the electrical pattern in the upper layer.

However, recording an image of a circuit pattern on the upper layer which is aligned to patterns formed on upper and lower layers is not trivial. Firstly, according to the method outlined above, the lower layer is covered by copper and any fiducial marks in the lower layer are not visible. Second, even if fiducial marks are visible, they must be associated with the position of the image to be written on the upper layer.

Applicant's copending U.S. patent application Ser. No. 09/708,160, filed Nov. 8, 2000, the disclosure of which is incorporated herein by reference, describes methods and apparatus for aligning the respective coordinate systems of a scanner portion of a laser direct imaging scanner and an imager, such as a camera, that views the printed circuit board while it is mounted on the scanner. The substance of this application is included the detailed description hereof.

While the methods of aligning the camera and apparatus for recording an electrical circuit pattern on a substrate shown in Applicant's copending U.S. patent application Ser. No. 09/708,160 comprise methods for performing such alignment, other methods of alignment may also be used in the present invention.

In accordance with one embodiment of the invention, the positions of marks formed on the lower layer are used to align the image being recorded on the upper layer with a pattern already formed on the lower layer. The marks may be made visible by forming openings in the upper layer through which the alignment markings can be viewed by the camera. Alternatively, the upper layer may be formed without a copper coating in the areas of the markings, for instance by masking those areas. If transparent or partially transparent dielectric materials are used for forming the upper layer, the markings can then be viewed by the imaging system and used for alignment of the image on the upper layer being written by the scanner.

Alternatively, use is made of vias that are drilled in an accurate position in the upper layer relative to a pattern on the lower layer to align the upper layer with the lower layer. In particular, as known in the art of printed circuit board manufacture, micro-vias are drilled on a micro-machining device which employs unveiled fiducial markings on a lower layer to drill the micro-vias in the upper layer in suitable alignment to the lower layer. Alternatively, the micro-machining device may use fiducial markings which are viewed with an x-ray imager, or holes drilled by a drilling including an x-ray imager, which holes are based on the internal conductive patterns the imager detects.

Still alternatively, use is made of a pattern that is produced with reference to drilled via holes, or with reference to the part of the electrical circuit pattern formed on the lower layer.

In accordance with an embodiment of the invention, a hole pattern or more usually a series of hole patterns, suitable for imaging, is drilled in the upper layer, if a second build-up layer is superimposed on the first, or is drilled as through holes additionally passing through the lower layer or layers. When the board is placed on an exposure device, such as a laser direct imaging scanner scanner, to record an image of a pattern on the upper layer, the holes are viewed by the camera and are used to determine (utilizing, inter alia, the transformation between the scanner and imaging coordinate systems) the appropriate location, and optionally scaling factor, for recording a pattern on the upper layer such that the image to be recorded is aligned with the holes.

In some embodiments of the invention, the hole patterns are drilled in positions determined by local features of the lower layer. These features may include alignment patterns especially formed onto the lower board. Such patterns may be used to provide an overall shrinkage factor to be applied to the board or to provide a full warping transform to the board. In writing upper board, the data is adjusted either on-the fly or by producing transformed data to fit the image to be written onto the lower image.

Similarly, when the lower layer has a number of alignment patterns that are visible when the upper layer is in place, the plurality of patterns can be used to provide either an overall shrinkage correction (which may be different in the x and y directions) or a full warp correction.

There is thus provided, in accordance with a preferred embodiment of the invention, a method for aligning an image to be recorded by a direct image scanner on an upper layer of a printed circuit board with an image recorded on a lower layer thereof, the method comprising:

visually imaging a portion of the image on the lower layer; and recording a pattern on the upper layer, referenced to coordinates of the visual image of the portion.

In an embodiment of the invention, the portion is an alignment pattern recorded on the lower layer. Optionally, the method comprises forming an opening in the upper layer through which the alignment pattern is visible. Optionally, the alignment pattern is visible through the upper layer.

In an embodiment of the invention recording includes providing an object aligned with the image portion; and recording the pattern on the upper layer, referenced to the object. Optionally, the object comprises holes formed in the upper layer. Optionally, the holes comprise holes that do not pass through the lower layer. Optionally, the holes are vias. Optionally, the holes comprise functional vias connecting patterns on the upper and lower layers. Optionally, where the images comprise electrical circuits and wherein the holes are not related to an electrical function of the printed circuit board. Optionally, the holes pass through the upper and lower layers. Optionally, the holes form an alignment pattern, referenced with the image on the lower layer. Optionally, the images comprise electrical circuits and wherein the holes are not related to an electrical function of the images. Optionally, the holes pass through the upper and lower layers.

In an embodiment of the invention, the method includes imaging the object; and determining a position of the object, wherein the pattern is recorded relative to the determined position.

There is further provided, in accordance with an embodiment of the invention, a method for aligning an image to be recorded by a direct image scanner on an upper layer of a printed circuit board substrate with a pattern on a lower layer thereof, the method comprising:

detecting at least one hole provided in the upper layer, said at least one hole being provided in predetermined alignment to said pattern and said at least one hole not passing through said lower layer; and scanning a pattern on the upper layer in predetermined alignment with said at least one hole.

There is further provided, in accordance with an embodiment of the invention, a method for recording an image on an upper layer of a multi-layered printed circuit board substrate, the method comprising:

forming at least one hole in an upper layer of a multi-layered printed circuit board substrate, said at least one hole having a known spatial orientation to a pattern formed on one layer of the substrate and said substrate having at least two layers of circuitry already formed thereon;

acquiring an image of the at least one hole;

calculating a location of the at least one hole from analysis of the image; and recording a pattern on the upper layer with reference to said location.

Optionally, forming at least one hole comprises forming at least one hole with a laser micro-machining device. Optionally, forming at least one hole comprises forming the at least one hole in at least the upper layer and not forming at least one hole in at least another layer of said multi-layered printed circuit board substrate. Optionally, acquiring an image includes acquiring a digital image of the at least one hole. Optionally, calculating a location of the at least one hole from analysis of the image comprises calculating a location of the at least one hole in a coordinate system of an image recording system. Optionally, recording a pattern comprises photosensitizing said upper layer and scanning a pattern onto the upper layer with a laser direct imaging system. Optionally, recording a pattern comprises photosensitizing said upper layer and imaging a pattern onto the upper layer through a mask. Optionally, the at least one hole a plurality of holes arranged in a non-periodic hole pattern. Optionally, holes forming the hole pattern do not pass through at least a layer of said multi-layered printed circuit board substrate. Optionally, holes forming the hole pattern pass through each layer of said multi-layered printed circuit board substrate.

There is further provided, in accordance with an embodiment of the invention, a method of image alignment, comprising:

producing an array of elements arranged in a non-periodic pattern on said image; and matching said pattern with an identical pattern, such that said image is aligned when the patterns overlay each other, wherein fewer than 50% of the elements of the alignment pattern in the image overlay the pattern in the identical pattern for any position in which the patterns are not aligned.

There is further provided, in accordance with an embodiment of the invention, apparatus for recording an electrical circuit pattern on an upper layer of a multi-layer printed circuit board substrate, comprising:

an alignment pattern generator generating an alignment pattern that is visible on the upper surface of the multi-layer printed circuit board substrate, said alignment pattern having a known orientation with respect to an electrical circuit pattern formed on one non-upper layer of the substrate, said substrate having at least two layers of circuitry already formed thereon;

an alignment pattern location sensor sensing a location of the alignment pattern; and an electrical circuit pattern generator recording an electrical circuit pattern on said upper surface in a desired orientation with reference to the alignment pattern.

Optionally, the alignment pattern generator is a micro machining device, optionally, a laser drill.

In an embodiment of the invention, the alignment pattern is defined by a plurality of holes in said upper surface. Optionally, plurality of holes is arranged in a non-periodic pattern.

Optionally, where the alignment pattern is defined by a plurality of micro-machined holes, the micro-machined holes do not pass through at least one layer in said multi-layered substrate. Optionally, the plurality of micro-machined holes is arranged in a non-periodic pattern.

In an embodiment of the invention, the alignment pattern is defined by a plurality of objects deposited on said upper surface, the objects being arranged in a non-periodic pattern. Optionally, the plurality of objects is a plurality of markings. Optionally, the markings are dimples.

In an embodiment of the invention, the alignment pattern location sensor comprises a digital camera and an image processing circuit operative to acquire an image and compute a location of said alignment pattern. Optionally, the location of the alignment pattern is computed in a coordinate system employed by said electrical circuit pattern generator. Optionally, the upper layer includes a photosensitized surface and the electrical circuit pattern generator is a laser direct imaging scanner selectively recording an electrical circuit pattern on the photosensitized surface. Optionally, the upper layer includes a photosensitized surface and the electrical circuit pattern generator comprises a phototool mask and a light projector projecting light through the phototool mask onto the photosensitized surface to selectively record an electrical circuit pattern thereon.

There is further provided, in accordance with an embodiment of the invention, apparatus for aligning a first electrical circuit pattern to be recorded on an upper layer of a multi-layer printed circuit board substrate to a second electrical circuit pattern formed on a lower layer of the multi-layer printed circuit board substrate, comprising:

an alignment pattern location sensor sensing a location of an alignment pattern located on a multi-layered printed circuit board substrate, said alignment pattern having a known orientation to said second electrical circuit pattern; and an electrical circuit pattern generator recording an electrical circuit pattern on said upper surface in a desired orientation with reference to the alignment pattern.

Exemplary embodiments of the invention is described in the following sections with reference to the drawings. The figures are generally not to scale and the same or similar reference numbers are used for the same or related features on different drawings.

DETAILED DESCRIPTION OF EXEMPLARY EMBODIMENTS

Figure 3:
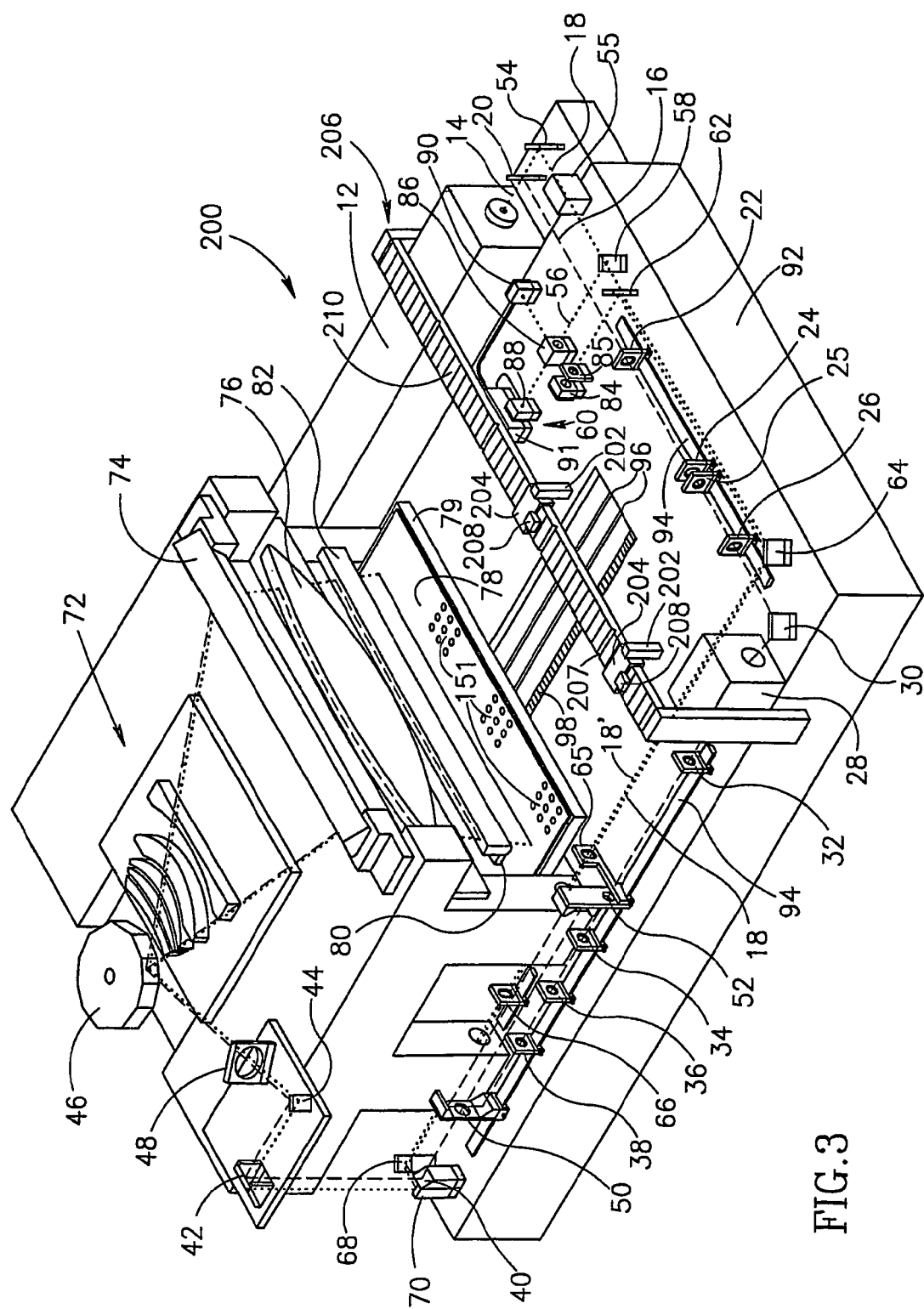
FIG. 3 shows a perspective drawing of a scanner in accordance with an embodiment of the invention.
Figure 4:
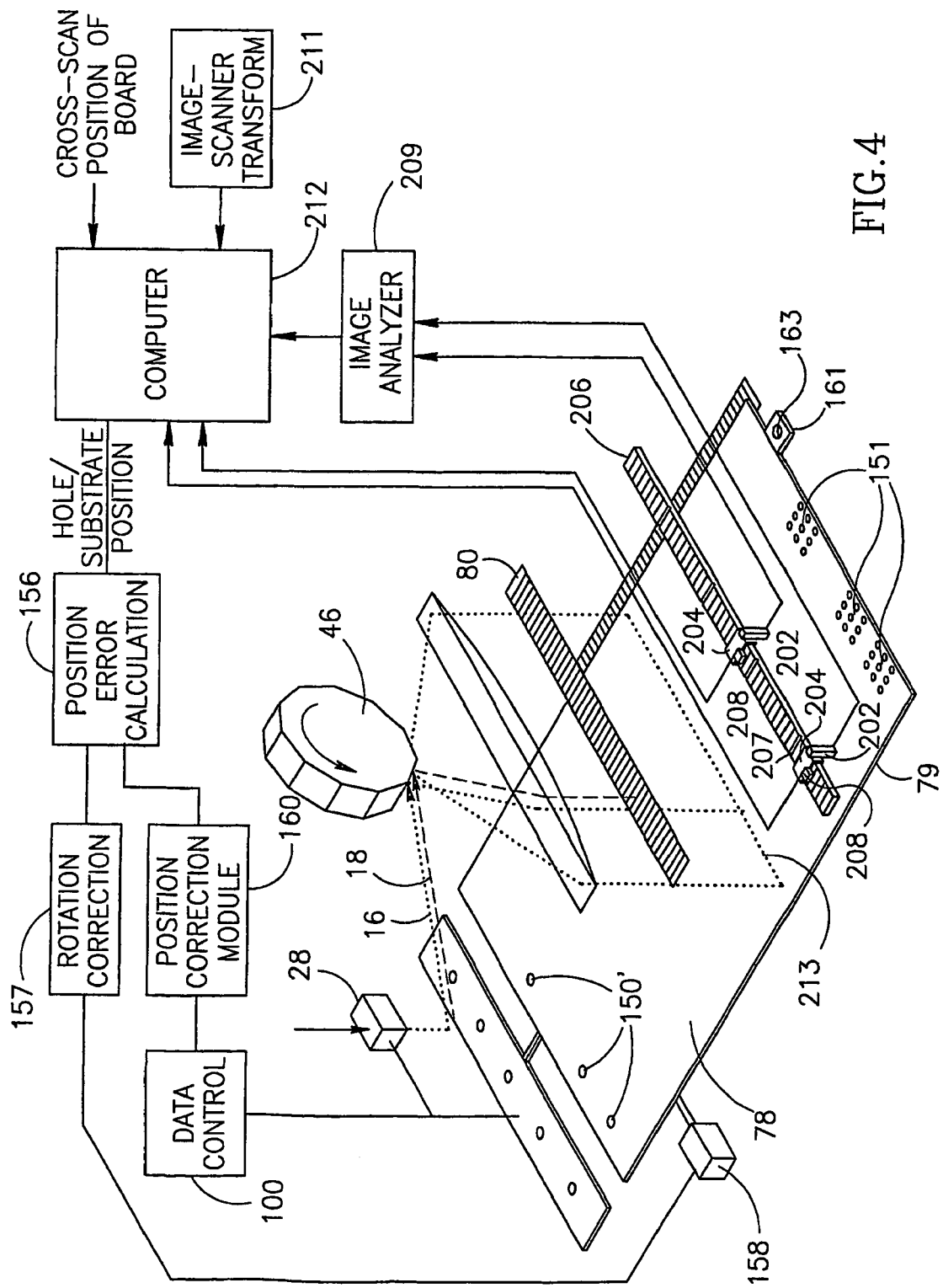
FIG. 4 shows a perspective drawing of a portion of the scanner of FIG. 3, related to the determination of printed circuit board position in accordance with an embodiment of the invention.

FIGS. 3 and 4 show an embodiment 200 of the present invention, which includes apparatus enabling the use of a new method of determining the relative position of the printed circuit board in the scanner useful for aligning images to be written on the respective opposing sides of a printed circuit board.

Figure 1:
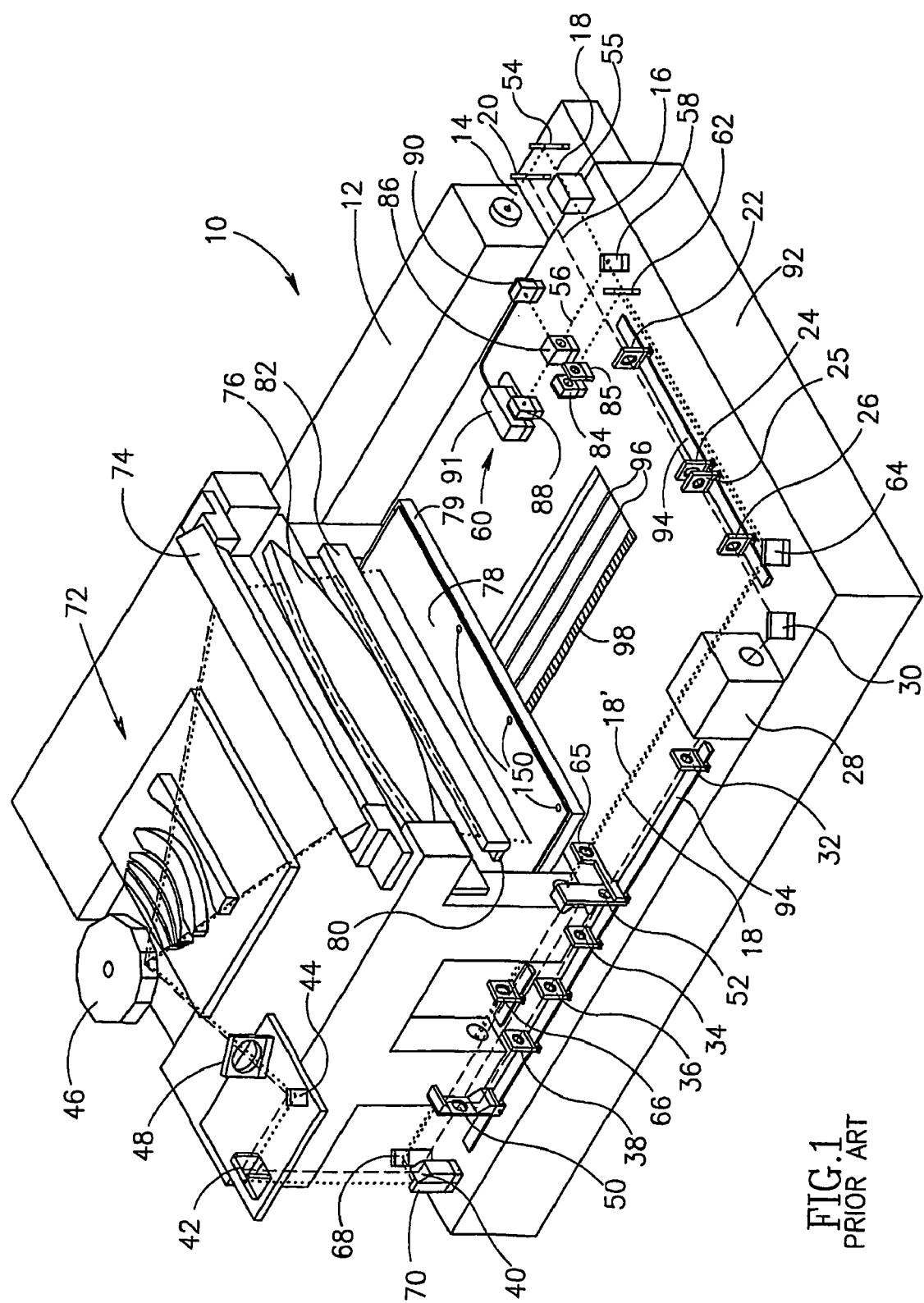
FIG. 1 shows a perspective drawing of a scanner, in accordance with the prior art.
Figure 2:
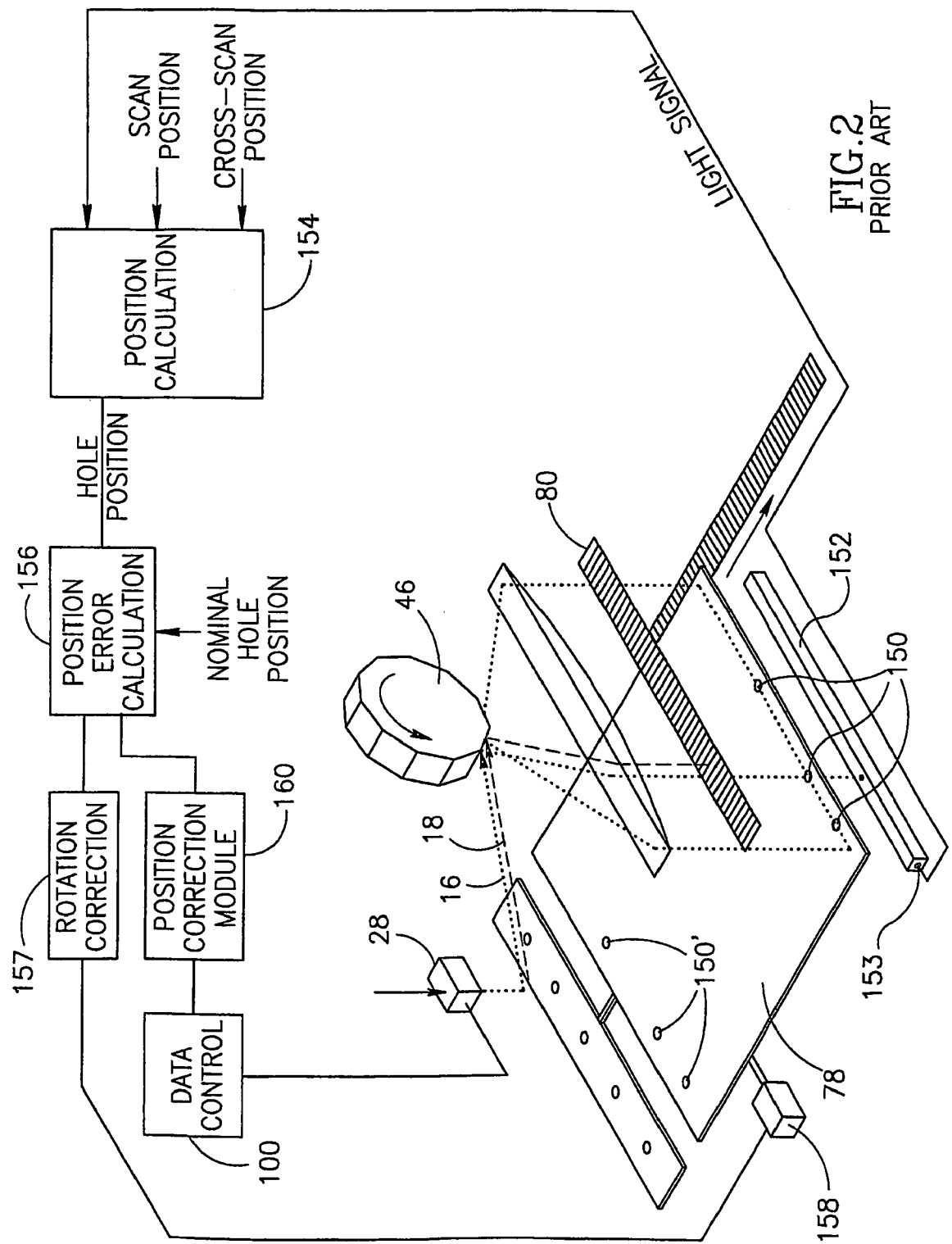
FIG. 2 shows a perspective drawing of a portion of the scanner of FIG. 1, related to the determination of printed circuit board position in accordance with the prior art.

In this system, a principal difference from the prior art system of FIGS. 1 and 2 resides in the mechanism for determining a reference for the scanner for writing an electrical circuit pattern.

Scanner—Imager Coordinate Calibration

It is appreciated that in order to align patterns that are sequentially recorded on a substrate a mechanism is required to coordinate between the respective location of the subsequently recorded patterns. In exemplary embodiments of the invention, an acquired image of a reference pattern is employed. It is desirable to tie together the location of the reference pattern in images to coordinate space of the scanner system to ensure that recorded patterns are properly aligned with respect to the reference pattern.

As shown in FIG. 3, system 200 includes two downward facing imagers 202, such as CCD cameras, mounted on a base 204. In the exemplary embodiment shown, bases 204 are moveably mounted on a rail 206. Movement of the imagers 202 along the rail may be manual or may be motorized using a motor (not shown) attached to the bases 204 or by other means as known in the art. Alternatively or additionally, the rail is formed with detents 207, into which matching elements, such as, for example, spring loaded elements, fit to selectively position the base at any one of a number of fixed positions. Additionally or alternatively, an encoder 208 may be used to determine the position of the base (and thus the imager) along the rail. Encoder 208 may be an optical encoder that determines the position based on a reading of markings 210 on rail 206. Alternatively, encoder 208 may be a mechanical encoder that measures the movement of the base along the rail. Any other type of suitable encoder or other suitable positioning method or method of measuring position, as known in the art, may be used. Alternatively, the imagers are fixed in place. Alternatively, as described below, a single camera may be used. Alternatively, more than two imagers may be used. Alternatively, cameras 202 may be fixed in place and folding mirrors (not shown) may be moveable along rail 206. It is noted that for the various imager configurations, arrangements may need to be provided to enable suitable movement of imagers 202 for adjustment of focusing.

Imagers 202 are positioned such that they view one or more features 151, which may be generated by the scanner or other suitable feature generation device. The image(s) of the feature(s) is(are) analyzed by an image analyzer 209 (which may be a properly programmed computer or other device known in the art) to determine the position of the feature in the coordinate system defined by the field of view of the imagers. These positions are fed to a computational system 212, which may be a general or special purpose computer or other circuitry. The computational system is referred to herein, for simplicity, as "computer 212". Computer 212 also receives an indication of the relative position of the imagers on the rail (when the imagers are not fixed). This indication may be sent to the computer by encoders 208, or, especially where manual movement and detents are used to position the imager, may be inputted manually to the computer.

Computer 212 also generally includes information regarding the relationship between the imager coordinate system and the scanner coordinate system (shown in FIG. 4 as being in an image-scanner transform memory 211), such that the measured position of the features in the imager coordinate system can be translated into the scanner coordinate system. In general, it is desirable (but may not be essential in all cases) to determine a transformation between the coordinate systems.

Figure 7:
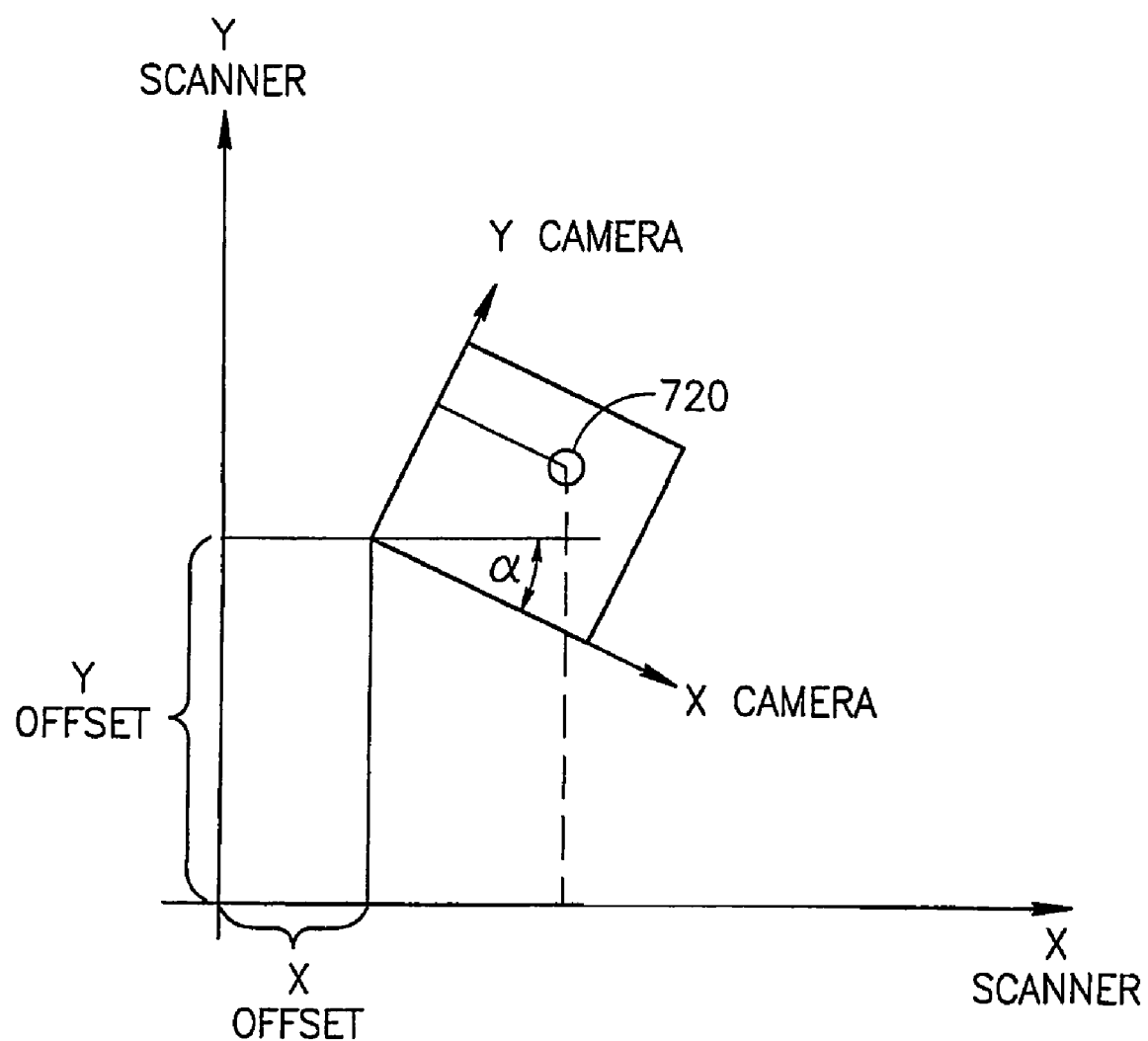
FIG. 7 is a simplified diagram showing calibration transformations between imager coordinate space and scanner coordinate space.

Reference is made to FIG. 7 which is a diagram illustrating calibration transformations that are performed in exemplary embodiments of the invention. Calibration between the imager coordinate system and the scanner coordinate system should account for mutual X, Y translation of a point 720 in imager coordinate space and scanner coordinate space respectively, angular alignment an of imager coordinate space relative to scanner coordinate space, and the size of a pixel in imager coordinate space compared to the size of a pixel written by the scanner.

Figure 5A:
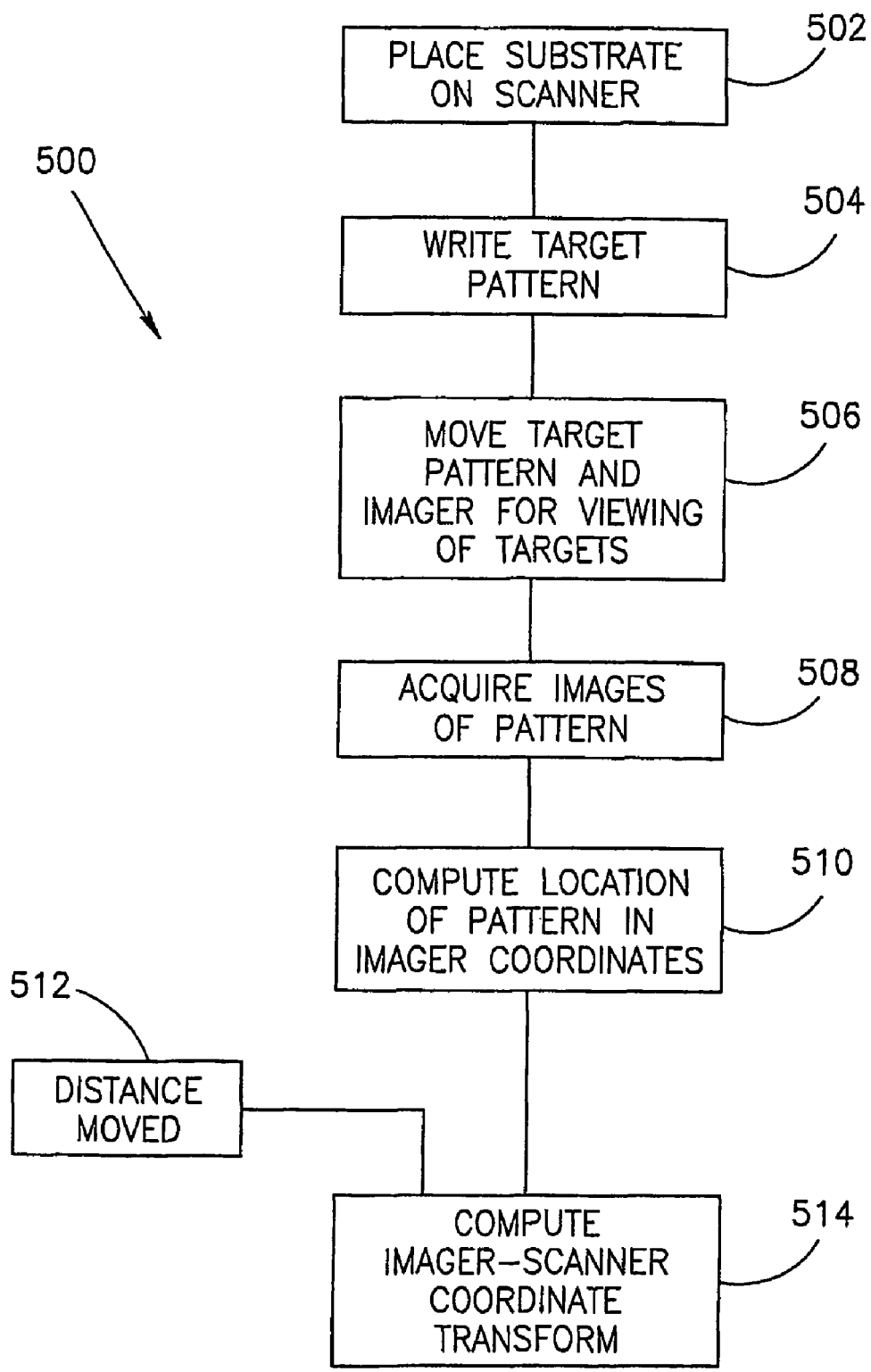
FIG. 5A is a simplified flow diagram of a method of determining an imager-scanner transform in accordance with an embodiment of the invention.

FIG. 5A is a flow diagram of an exemplary method 500 of determining the translation of the coordinate systems in a calibration stage typically performed prior to scanning a batch of printed circuit board substrates to record an image of an electrical circuit pattern thereon.

First (502) a bare photosensitized substrate 78 is placed on the scanner. For the purposes of calibration, no particular orientation of the substrate is necessary, provided that a pattern, or patterns, may be written on the substrate, and that substrate 78 is held in a fixed orientation to a stage 79 (FIG. 3) during the writing and the subsequent imaging by imagers 202.

Next, a "target" pattern 151 of a known size, orientation and position in is written (504) on the sensitized substrate by scanner system 200. In one embodiment of the invention, the sensitized material is of a type that produces a visible "latent" or "printout" image which can be seen even without development or etching when exposed to the (generally, but not always, UV) light used to write the pattern on the sensitized substrate. A suitable substrate for use in the calibration process which forms a visible "latent" image when exposed to UV light of a scanner system is Dulux Registration Master photosensitive sheets available from DuPont.

In exemplary embodiments of the invention, the target pattern or patterns for calibration are written onto the photosensitive substrate such that they can be viewed from one or more positions at which the imager can be placed, and in particular, at positions at or near where the imagers are placed to view alignment patterns written on the substrate during scanning. The pattern is written on a portion of the substrate that is located under the scanning line 213 shown in FIG. 4. Optionally an array of alignment patterns is written and the patterns in the array are viewed sequentially.

A plurality of alignment patterns 151 is optionally written at various imager positions such that these patterns can be imaged by one or more imagers 202 (FIG. 3 and FIG. 4).

Then the scanner 200 moves the substrate (506) such that the patterns are in a position for viewing by the imager(s). The imagers are placed in position (when they have to be used) so that they sequentially view each of the patterns 151, and the location of each pattern 151 is stored in image-scanner transform memory 211. As is well known and as is shown in FIGS. 1 and 2, scanners are provided with very accurate means for measuring the movement of the substrate in the cross-scan direction, as well as for determining the precise location at which a beam 16 records data in the scan direction.

The imagers acquire images of the patterns (508) and pass them to analyzer 209, which may be, in a practical situation hardware and software associated with computer 212.

Analyzer 209 computes a reference location of each pattern, for example a center point, a corner point, or some other reference point in the pattern, with respect to the particular imager coordinates and passes the information to computer 212.

Computer 212 calculates (510) the position, orientation and scaling of the patterns in the imager coordinate system. This calculation may be determined, for example, by determining the position of the pattern in the imager coordinate system and then transforming this position by the measured movement of the substrate. Suitable methods for determining the location of the pattern in the imager coordinate system include blob analysis and pattern matching. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

Computer 212 also receives information as to the distance moved by the substrate during the movement (512), as described above.

Computer 212 computes a transform (514) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

The patterns 151 may be a simple cross-hair pattern or they may be a more complex pattern. Alternatively, the pattern may comprise a series of crosses or dots.

Figure 6:
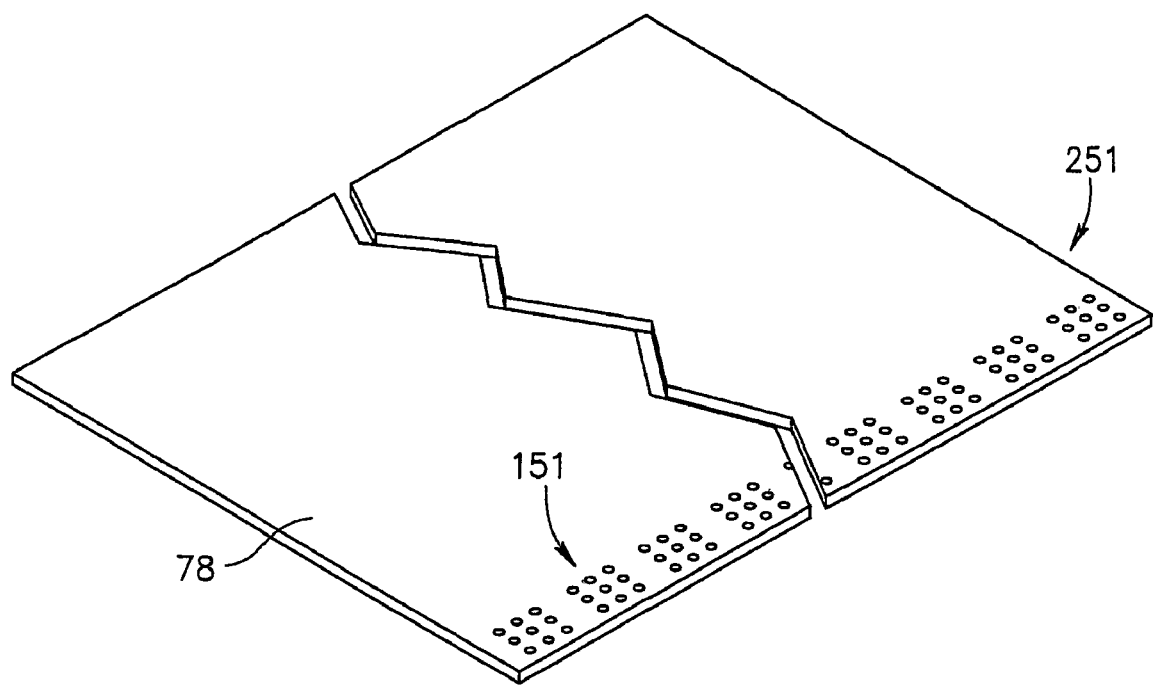
FIG. 6 shows a perspective drawing of an array of calibration and/or alignment patterns written on a substrate.

Reference is now made to FIG. 6 which illustrates an array 251 of exemplary patterns 151 employed to calibrate X, Y translation between the imager coordinate space and scanner coordinate space. As seen in FIG. 6, array 251 comprises a plurality two dimensional patterns 151 generally extending the length of an edge of substrate 78, wherein each pattern 151 is formed of a 3×3 matrix of equidistant dots. As seen in the exemplary pattern appearing in FIG. 6 a suitable pattern comprises a 2-dimensional 3×3 array of 0.08" diameter dots mutually spaced apart by 0.1". Other suitable arrays of patterns, including suitably sized dots and distances between the dots, may also be used.

These patterns, when written by a scanner system, allow for the determination of X and Y translation distances, precise determination of a center point of the pattern for calibration of a transform, and an angular orientation of an imager in space relative to the scanner so as to enable compensation for angular offset, distortion, and differences in magnification between extremities of an image acquired by the imager, and coordination of camera pixel size to scanner pixel size.

It is noted that when an array 251 of patterns 151 is used, the position for each pattern is determined and its respective translation is stored in a data base thus correlating position translation of imager for a series of locations. Moreover, the calculation may be based on movement of the substrate, location of an imager 202 with respect to each pattern 151 in array 251 and the location of the reference point in each of images 151 in the field of view of an imager 202.

The calibration described with respect to FIG. 5A may be repeated as desired to assure that there is no change in the transformation. It could even be performed on each PCB, although this is seldom necessary. However, since the method requires writing of a particular calibration pattern each time, it is also possible to perform a simplified check on the transformation, as described with reference to FIG. 5B, which shows a method 530 which may result in a correction to the basic alignment achieved by the method of FIG. 5A. In accordance with some embodiments of the invention a jig 161, comprising a through hole 163, attached to base 79 is provided to facilitate coordinate space alignment between the coordinate systems of imagers 202 and scanner system 200.

Figure 5B:
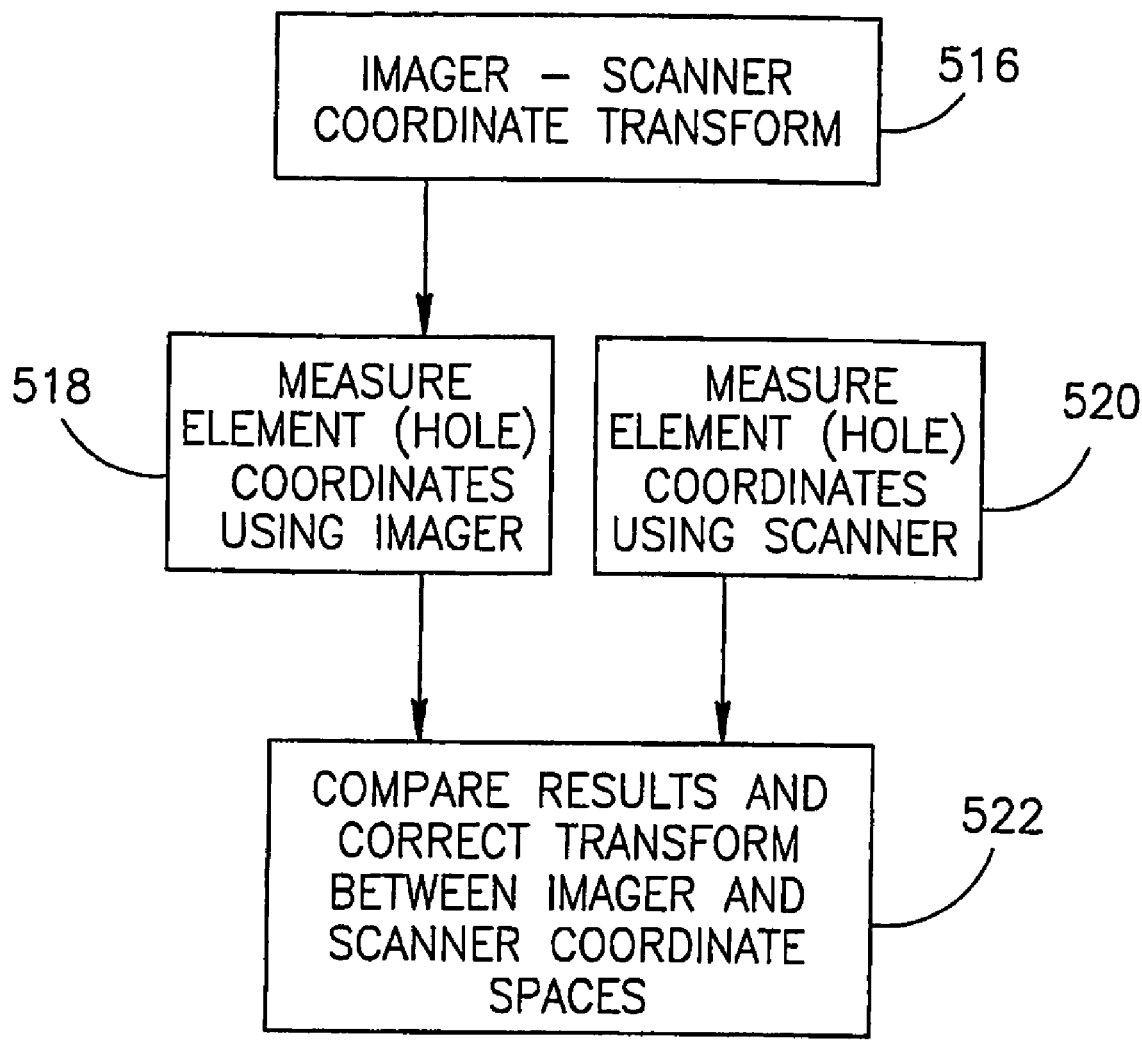
FIG. 5B is a simplified flow diagram of a method of calculating offset corrections between imagers and scanner prior to imaging a circuit pattern.

As seen in the flow chart of FIG. 5B, image scanner coordinate transform data, for example, as derived using the method of FIG. 5A, is received (516). The location of hole 163 is determined using an imager (518) and transformed to scanner coordinates using the transform. The location of hole 163 is also determined in the coordinate system of scanner 200 using beam 16 (520). A suitable method for determining the location of hole 163 using beam 163 is described in PCT patent publication WO 00/02424 and with respect to FIG. 2 above. Beam 16 is scanned over hole 163, and a collector 152 is provided underneath base 79 to, collect light inputs as beam scans the hole. On-off modulation, as the beam passes the hole, of the signal from the light collector enables precise determination of the location of edges of hole 163, and precise determination of the location of the center of hole 163 therefrom. The location of hole 163 as determined by an imager 202 and corrected by the imager scanner coordinate transform, and the hole location determined using beam 16 are compared (522) and aligned to ensure precise correlation between imager coordinate space and scanner coordinate space for each scan. The alignment factor is stored in computer 212.

Figure 5C:
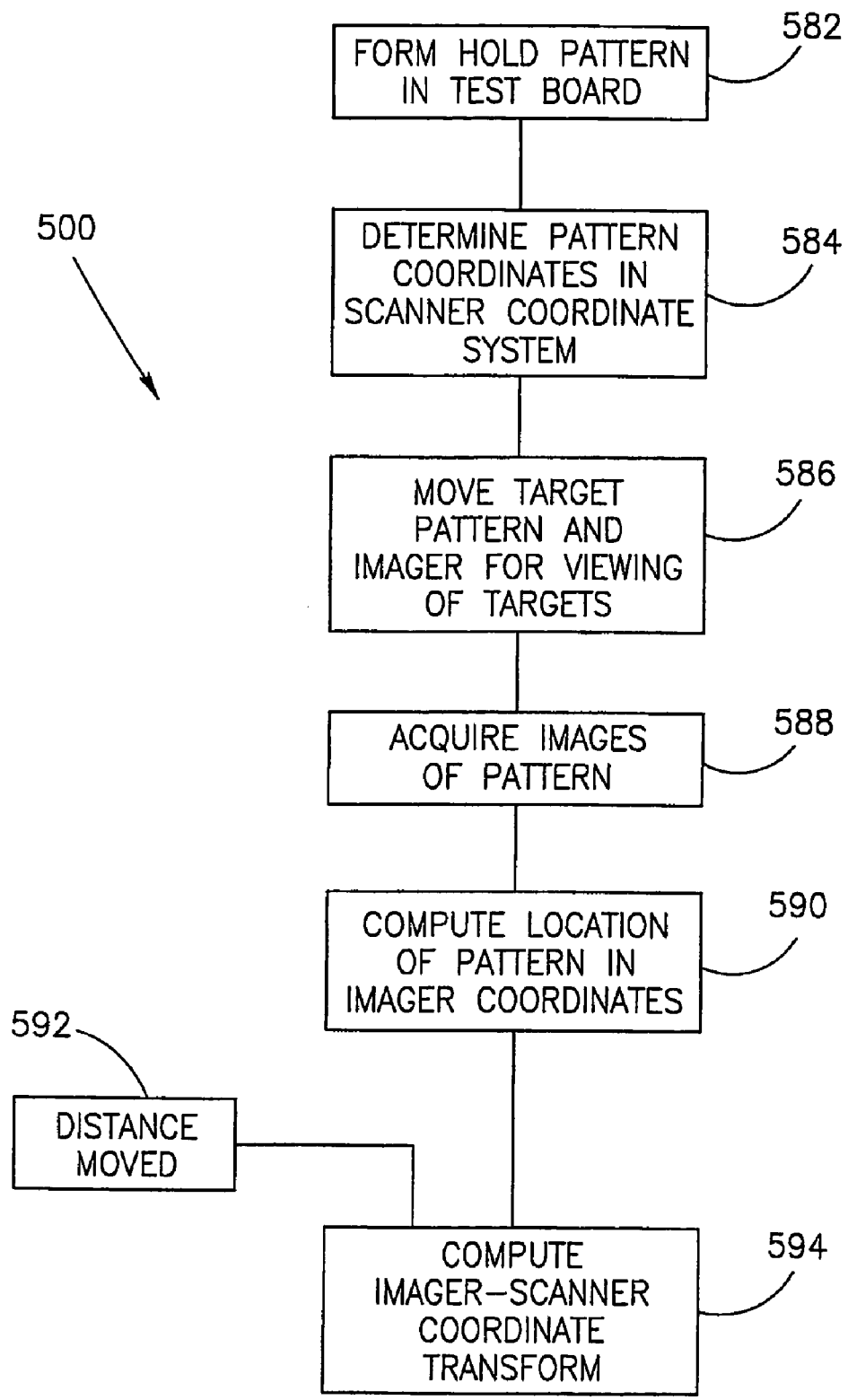
FIG. 5C is a simplified flow diagram of an alternative method of determining an imager-scanner transform in accordance with an embodiment of the invention.

FIG. 5C shows another method (580) for determining a transform between the imager and scanner coordinate systems respectively. In this method a series of patterns of holes, such as holes in the pattern shown in FIG. 6 is formed in a calibration board (582). Alternatively, simpler patterns may be formed.

The coordinates of the pattern are determined in scanner space using the method described in PCT patent publication WO 00/02424 and with respect to FIGS. 2 and 5B above (584). The board is then moved (586), together with the table, the accurate table-motion measuring system built in to the scanner.

The imagers acquire images of the patterns (588) and pass them to analyzer 209, which may be, in a practical situation hardware and/or software associated with computer 212.

Analyzer 209 computes (590) a reference location of each pattern, for example a center point, a corner point, or some other reference point in the pattern, with respect to the particular imager coordinates and passes the information to computer 212.

Computer 212 calculates (590) the position, orientation and scaling of the patterns in the imager coordinate system. This calculation may be determined, for example, by determining the position of the pattern in the imager system and then transforming this position by the measured movement of the substrate. It may be helpful to calibrate the imagers against each other by having them view the same pattern, without moving the pattern. To do this, the imagers are sequentially positioned to view the pattern (for example using the same detent for more than one imager). The positions (and optionally the orientations) of the images is used to determine a transformation which corrects for the differing placements of the imagers on their respective bases.

While this system does allow for the determination of an accurate transform, it requires the production of a special printed circuit board jig and the provision of a table with holes and a detector such as detector 152, 153 shown in FIG. 2.

Computer 212 also receives information as to the distance moved by the substrate during the movement (592), as described above.

Computer 212 computes a transform (594) between the coordinate systems of each imager and of the scanner respectively. This transform is based on the known positions at which a calibration pattern was written in the scanner coordinate system, the distance the board traveled and the position of the pattern in the imager coordinate system. This transformation may be stored in memory locations in computer 212, which may be a general purpose computer or a special purpose computer.

This transform (including information relating the coordinate systems of the various imagers in the various positions to the overall imager coordinate system) is stored, for example in image scanner transform memory 211, for use by the computer.

In some embodiments of the invention greater accuracy in determining the transform and greater accuracy in determining the position of alignment patterns can be achieved by calibrating the field of view of the imager itself. A method 600 of performing such calibration is shown schematically in the flow chart of FIG. 8. In some embodiments of the invention, calibration of the field of view of the imager is performed as a single step along with determination of the translation of the coordinate systems.

A calibration pattern is provided (602) for viewing by the imager. In an embodiment of the invention, an accurate pattern, for example an array of precisely sized and positioned dots appearing as a pattern 151 in FIG. 6, is scanned onto or formed in a substrate by scanner system 200. In some exemplary embodiments, it is sufficient to use a single pattern 151 for the purpose of field of calibration, although improved results may be obtained by using multiple patterns 151.

The patterns and imagers are moved to enable viewing of the patterns by respective imagers and images of the calibration patterns is acquired (604). The locations of the pattern elements forming patterns 151 in the coordinate system of the imager are determined (606) by image analyzer 209 or by computer 212 and compared (608) to the actual relative positions of the elements on the pattern, determined, for example from knowledge of the location where they are recorded by scanner system 200.

Due to variations in the magnification of the image pattern as seen by the imager, distortion, angular orientation of the imager in space not in alignment with respect to the scanner, and aberrations in the imager optics, the position and size of the elements on the image (in the coordinates of the particular imager) may not precisely correspond to those of the actual pattern. Analysis of the image enables physical adjustment of the imager to partially align the imager relative to the scanner. Additionally, computer 212 computes a calibration transformation (610) to transform imager coordinate position with the actual position in the field of view of the imager to calibrate pixel size of pixels in the imager to the pixel size of pixels written by the scanner and to correct for any remaining, magnification errors, distortions or other image aberrations.

It should be understood that the actual position of the pattern is not critical since it is the relative positions, spacings and/or size of the elements of pattern in the field of view of the imager that is used to calibrate the field of view of an imager. This transformation is used in all measurements made with the imager, as for example, the measurements of position of a pattern as in the method of FIG. 5 or in the position of an alignment pattern in a substrate. The corrections for pixel size may be a single value as a function globally correcting for all pixels, or a function taking into account magnification errors, distortions and aberrations that are not uniform over the entire field of view of an imager 202.

Figure 8:
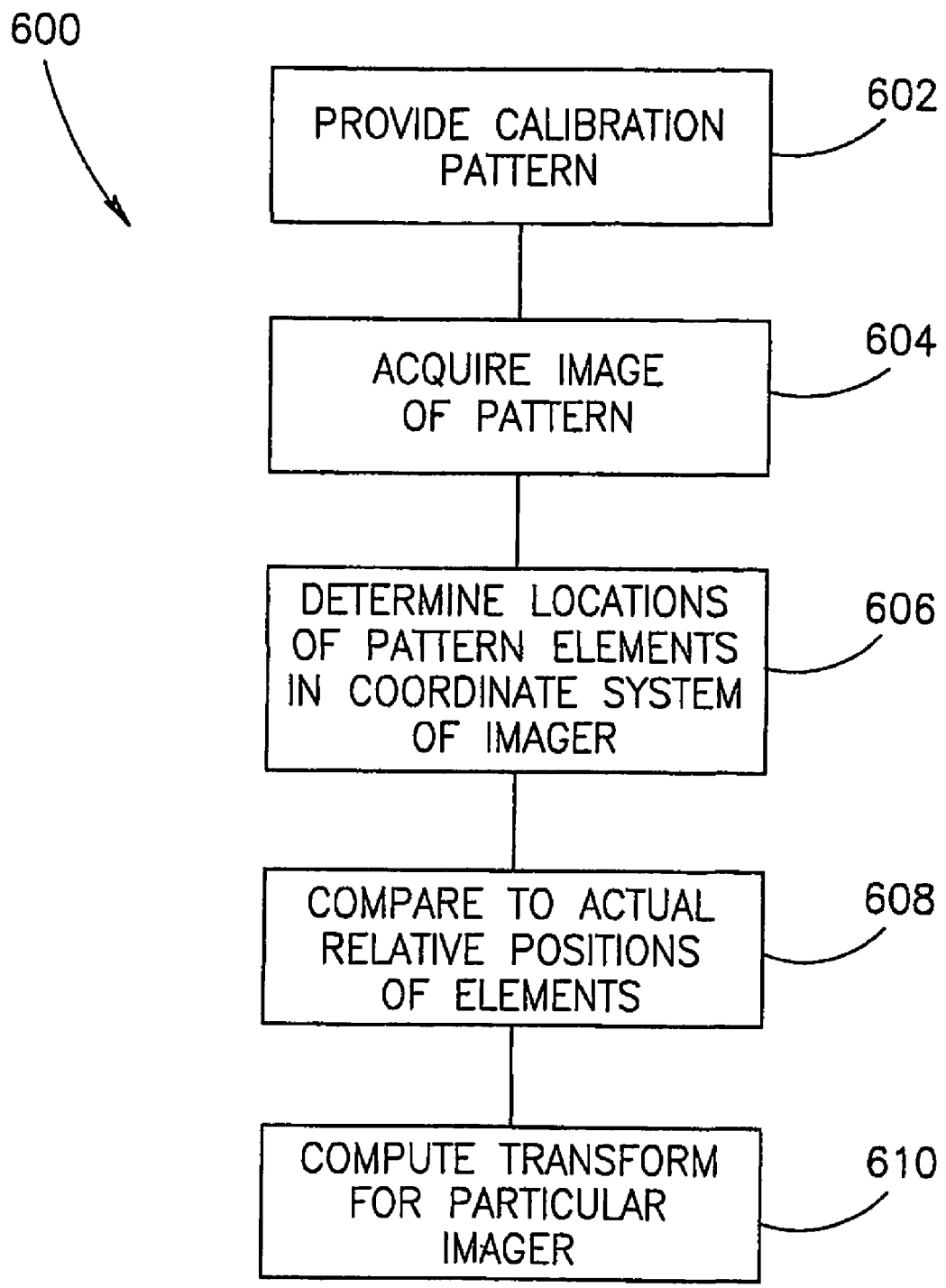
FIG. 8 is a simplified flow diagram of a method of computing position corrections in the field of view of an imager, such as a camera, used in scanner, in accordance with an embodiment of the invention.

It should be understood that the methods of FIGS. 5 and 8 can be performed in essentially a single operation by writing a pattern on a sensitized substrate that can be used for both determining a coordinate transformation between the imager and scanner systems and an internal calibration of the field of view of the imagers. For example, if a pattern comprising an array of equally spaced elements (such as dots or cross-hairs having different extent from the central one) is written on the board, a center point of the array can be calculated and used to determine the coordinate transform between the imager system and the scanner system. Alternatively, a cross hairs indicating a particular reference point along with additional elements may be provided. Either way, the plurality of elements can be used to calibrate the field of view of the imager itself and calibrate the coordinate space of the field of view of the imager to correspond to the coordinate spaced of the scanner.

The transform may be stored in image analyzer 209 and may be used to correct images received from imagers 202 before any processing is performed on or using them.

Sequential Build up Alignment

Figure 9A:
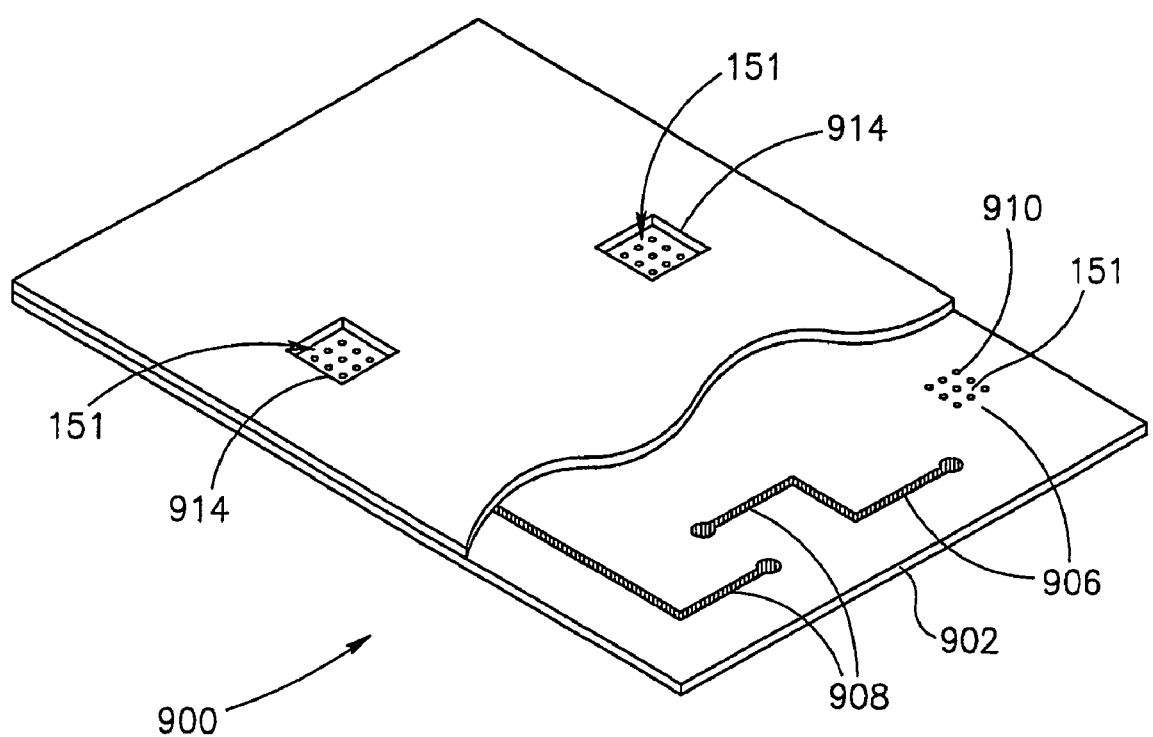
FIG. 9A shows a perspective drawing of a multi-layer printed circuit board having optical openings for viewing an alignment pattern on a lower layer thereof.
Figure 9B:
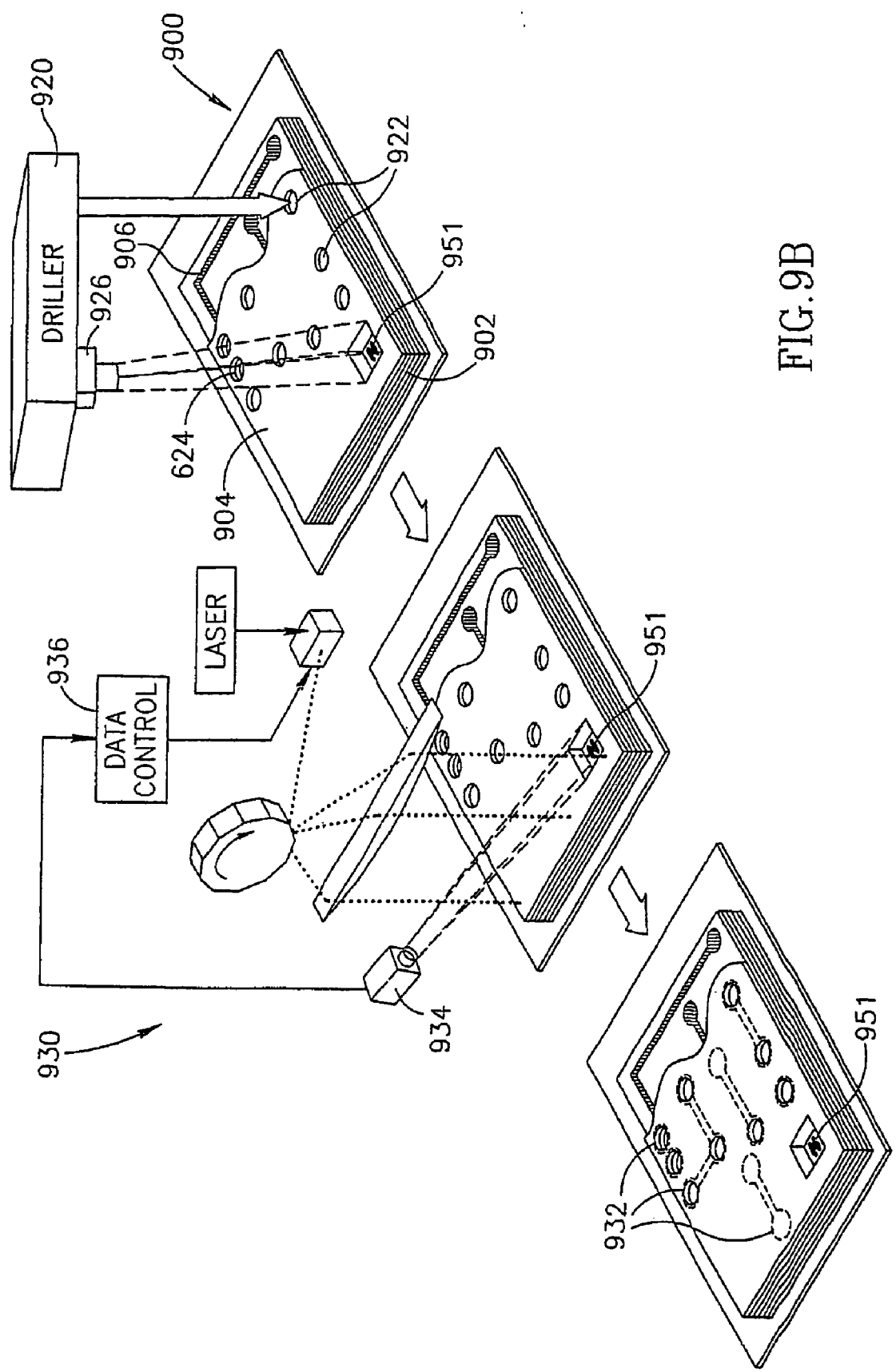
FIG. 9B shows a simplified pictorial illustration of a methodology for manufacturing sequential build up printed circuit boards in accordance with an embodiment of the invention.
Figure 9C:
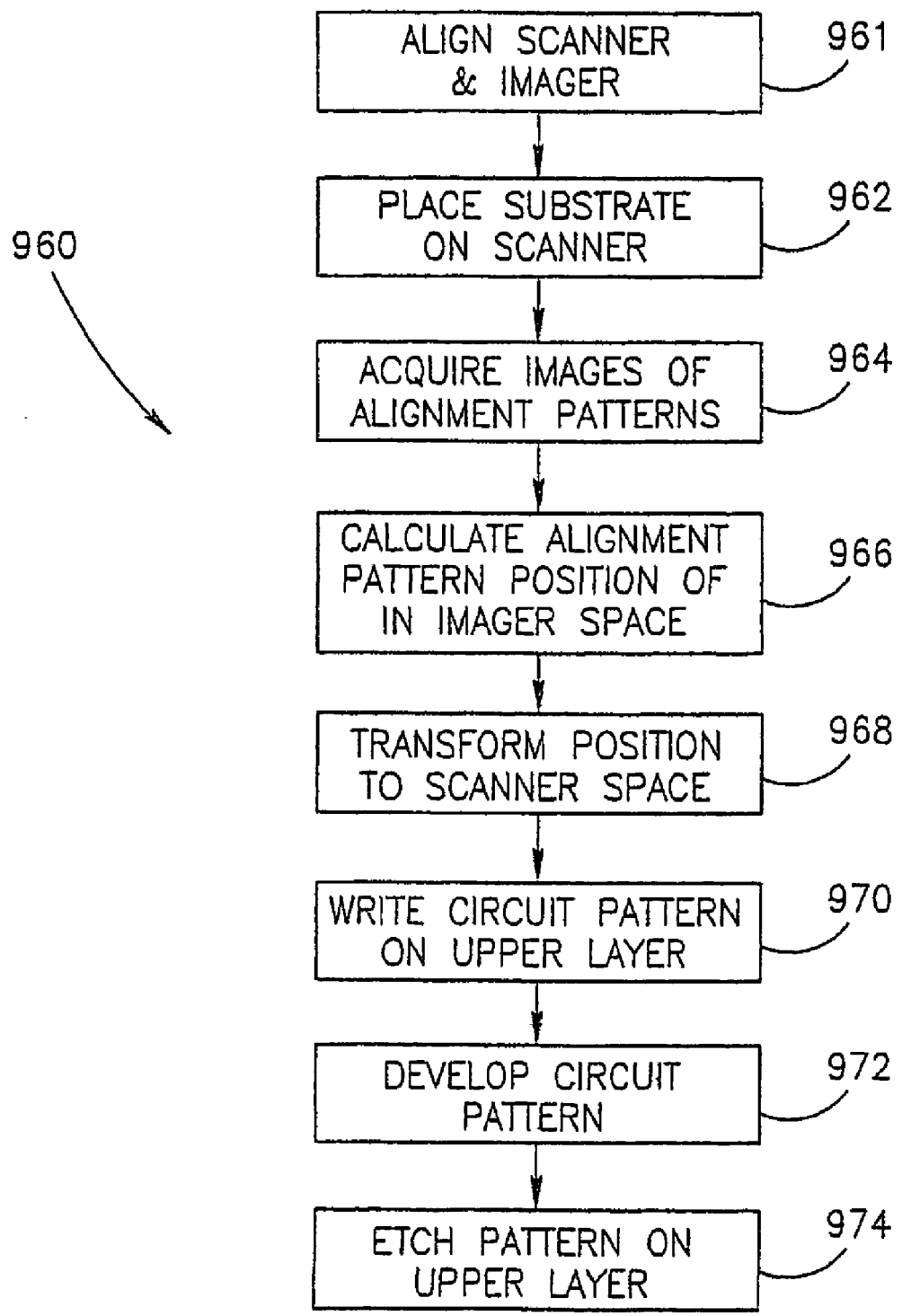
FIG. 9C is a simplified flow diagram of a method of aligning the image to be written on an upper layer with an image already formed on the lower layer for the circuit board of FIG. 9A.

Reference is made to FIG. 9A which shows a printed circuit board 900 formed of a lower layer 902 and an upper layer 904 in accordance with an exemplary embodiment of the invention, to FIG. 9B which shows a system for recording an image on an upper layer 904 with reference to a registration target on a lower layer 902 in accordance with an exemplary embodiment of the invention, and to FIG. 9C which shows a flow chart for aligning coordinate system of an exposure system with the pattern written on lower layer 902 in accordance with an exemplary embodiment of the invention.

In FIG. 9A, a portion of upper layer 904 is cut away to enable visualization of a pattern 906 formed on lower layer 902. It is appreciated that lower layer may be a single layer as shown in FIG. 9A, or a core of a printed circuit board formed of several layers as shown in FIG. 9B. Pattern 906 forms part of an electrical circuit 908 and one or more alignment markings 910. Alignment markings 910 may comprise a single dot, a rectangular array of dots, such as the 3×3 array 151 (FIG. 9A), a cross or series of crosses, a pair of vertex-to-vertex triangles 951 (FIG. 9B), an array of dots 1151 arranged in a non-periodic pattern such as that shown in FIG. 1A, or any other suitable pattern.

In the exemplary embodiment shown in FIG. 9A, upper layer 904 is formed with one or more windows 914 through which alignment markings located on lower layer 902 can be seen, even when the upper layer 904 is in place. It is appreciated that the alignment markings may be located on the lower layer that is immediately below upper layer 904, or on any lower layer located within in a core of several layers. The windows 914 may be actual physical openings formed in upper layer 904. Alternatively, if the upper layer is formed of a dielectric and a photoresist that are at least partly transparent, it is sufficient to omit the copper cladding on the upper layers in the alignment regions.

Figure 11:
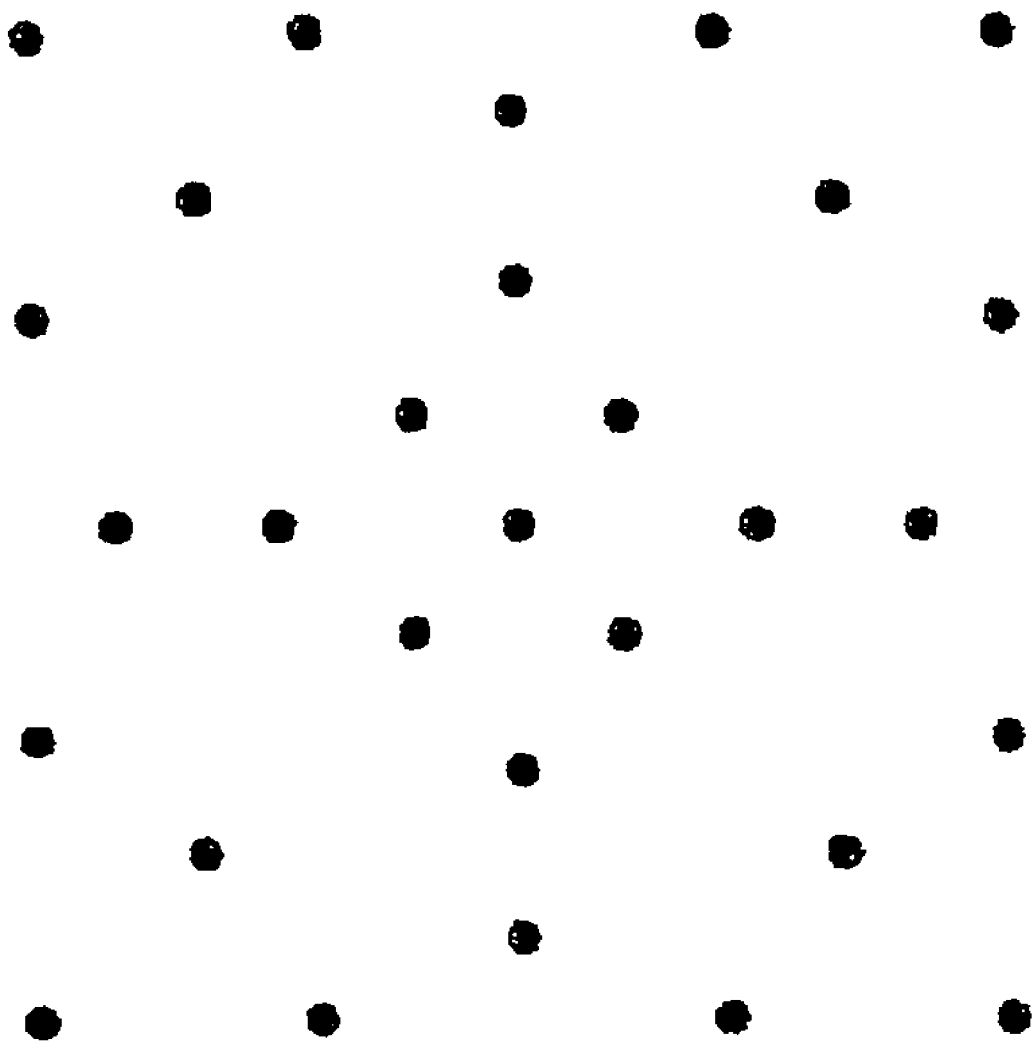
FIG. 11 is an alternative calibration and/or alignment pattern, in accordance with an embodiment of the invention.

A dot pattern 1151, shown in FIG. 11, may be useful as an alignment pattern 151 (FIG. 9A) for alignment of layers. The array shown in FIG. 11 is particularly useful in automatic alignment systems and in systems in which the quality of the image may be poor, since the correlation for offsets that are one or two rows or columns is much lower than that for proper alignment. Thus, the pattern shown provides a wide tolerance for unprinted dots or the like. It is noted that pattern 1151 may be defined either by holes, for example by laser drilling through some or all of the layers defining a printed circuit board substrate, or by a pattern written by a scanner or otherwise formed in a printed circuit board.

As seen in FIG. 11, pattern 1151 is formed of an array of suitably sized dots 1152 which are spaced apart in a generally non-periodic arrangement. The dots may be defined by drilled holes (for example drilled by laser or mechanical means), printed patterns, impressions or any other suitable markings. As appreciated from FIG. 11, due to the non-periodic arrangement of pattern 1151, if two identical patterns are superimposed one on top of the other but are partially offset from each other along either the X axis or along the Y axis, or otherwise, even if at least one row or column is mutually aligned among the patterns, then only a small number of dots of the two patterns will overlay each other. This is in contrast to regular matrices of patterns in which, even when the patterns are offset, most of the dots will overlay each other. In a 2×2 regular matrix of elements, 50% of the dots in one matrix will be aligned with dots in the other matrix, even when the pattern is not in alignment and in a 3×3 regular matrix up to ⅔ of the dots can be aligned without the pattern being fully aligned.

In contrast, in accordance with embodiments of the present invention, the overlap of dots is always less 50% and optionally less than 40, 30, 20 or 15%. In the exemplary embodiment according to FIG. 11 having 29 dots, no more than four dots can overlap for any non-aligned position (less than 14%). It will be clear, to a person of skill in the art that larger or smaller non-periodic arrays can be generated that have a larger or smaller percentage of maximum dots aligned in a non-aligned condition.

In accordance with an exemplary embodiment of the invention, seen in FIG. 9B, a micro-machining device, such as a driller 920, is provided at a first workstation to produce micro-via holes 922 in a substrate 900 formed of an upper layer 904 and several lower layers 902. Substrate 900 may be provided with through holes 924 which may be drilled either by driller 920 or other suitable drilling apparatus.

It is appreciated that upper layer 904 seen in FIG. 9B is cut away to expose part of a pattern 906 on the uppermost part of lower layers 902. Typically, driller 920 includes a sensor unit 926, such as a digital camera, or other suitable sensor, and suitable image processing circuitry (not shown) operative to image one or more suitable alignment targets, such as an unveiled target 951, and determine their respective locations. Microvia holes 922 and through holes 924 are formed at locations aligned with referenced to the location of target 951.

In a separate step, typically performed at a work station separate from driller 920, a pattern recording system 930 is provided to record electrical circuit patterns 932 on upper surface 904. In exemplary embodiments of the invention, pattern recording system is a laser direct imaging system such as a DP-100 laser direct imaging system available from Orbotech Ltd. of Yavne, Israel, configured with imagers substantially as described hereinabove with reference to FIGS. 3 & 4. In exemplary embodiments of the invention, pattern recording system 930 is operative to dynamically scale pattern data in response to the respective locations of several alignment fiducials 951, as described in PCT patent publication WO 00/02424. It is appreciated that other suitable pattern recording systems, such as conventional steppers and projectors exposing a photosensitive coating through suitable phototools containing an image of a pattern to be recorded, may be employed to record patterns 932 on substrate 900.

As seen in FIG. 9B, system 930 includes an imager 934 which images alignment targets 951 and provides location information relating to alignment targets to a data controller 936, typically following suitable analysis and computation in computational means as described in greater detail with respect to FIG. 4. Data controller suitably adjusts the location of pattern 932 on upper surface 904 in response to the location of target 951.

FIG. 9C shows a flow chart (960) for aligning the scanner coordinate system with the pattern written on the lower layer 902, useful in recording of an image of an electrical circuit pattern as shown in FIG. 9B.

Prior to scanning a batch of electrical circuits, the coordinate space of the imager 202 and of the pattern recording system 930, such as scanner system 200 (FIG. 3), are calibrated and aligned (961) for example, as described above and with reference to FIGS. 1–8.

A substrate on which an electrical circuit pattern is to be written on an upper layer 904 thereof is placed on the scanner (962). The substrate is formed so that its outer surface is coated with a photoresist and at least a portion of the surface is non-opaque. The non-opaque portion may be a portion that is formed, for example, by not applying copper to a translucent substrate, or that is formed by cutting in the substrate. In accordance with some embodiments of the invention, the non-opaque portion overlays an alignment pattern formed on the lower layer, as shown in FIGS. 9A and 9B.

Images of unveiled alignment patterns (951 in FIG. 9B) visible through the non-opaque portions of the substrate are acquired (964), and the position of the alignment patterns in imager coordinate space is calculated (966). In exemplary embodiments of the invention, using transform data stored in image-scanner transform obtained from a previously performed calibration, for example as described hereinabove with respect to FIGS. 5 and 8 the position of the alignment pattern is transformed to a position in scanner coordinate space (968).

Once the position of the alignment patterns is known in scanner coordinate space, the substrate may be optionally rotated by the scanner, based on the measurements, as necessary to obtain rotational alignment to the grid pattern of the scanner system. See elements 157, 158 and 160 in FIG. 4. A circuit pattern is written with reference to the position of the alignment patterns in scanner coordinate space (970). It is noted that multiple alignment patterns may be provided and the pattern written is scaled with reference to the mutual locations of the patterns. The substrate subsequently is removed from the scanner, the exposed circuit pattern written by the scanner is developed (972) and etched (974) to form part of an electrical circuit.

It is appreciated that although FIG. 9B shows vias being formed prior to imaging by system 930, vias between the layers may be formed either before or after recordation of the circuit on the upper layer.

Figure 10A:
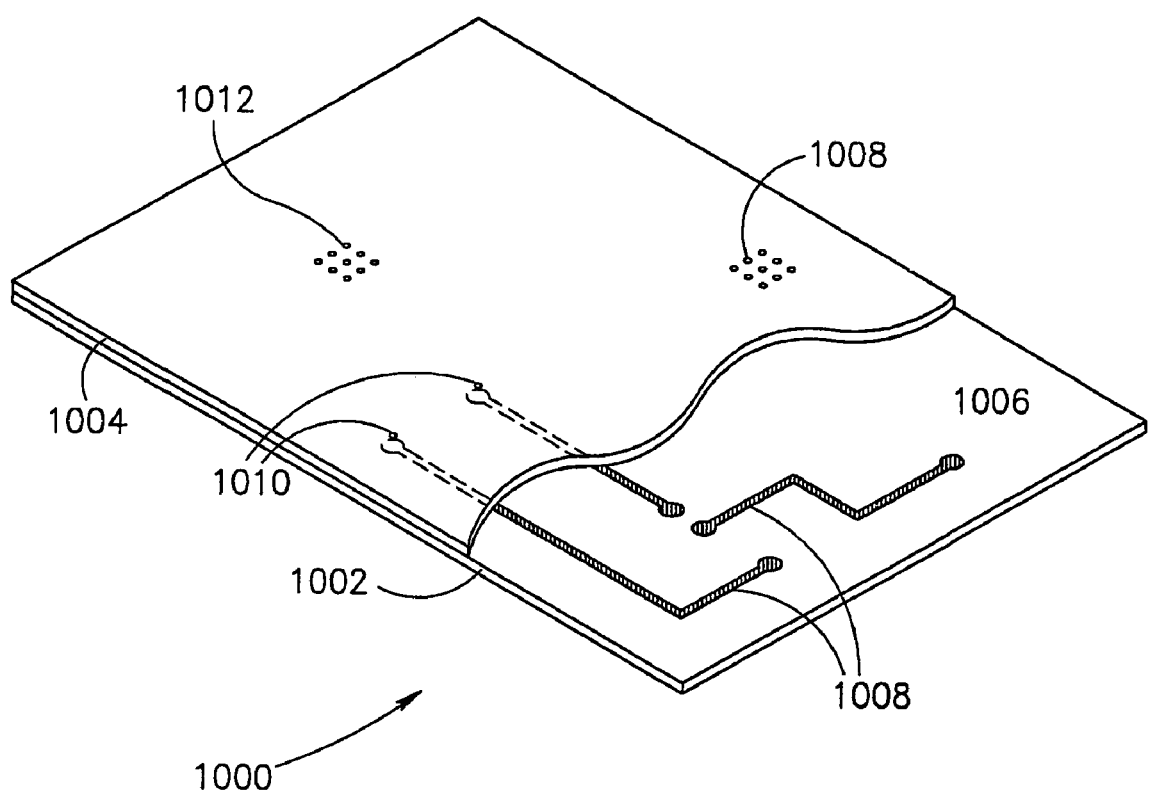
FIG. 10A is shows a perspective drawing of a portion of a multi-layer printed circuit board having vias and, optionally, alignment holes, formed between the upper and lower layers.
Figure 10B:
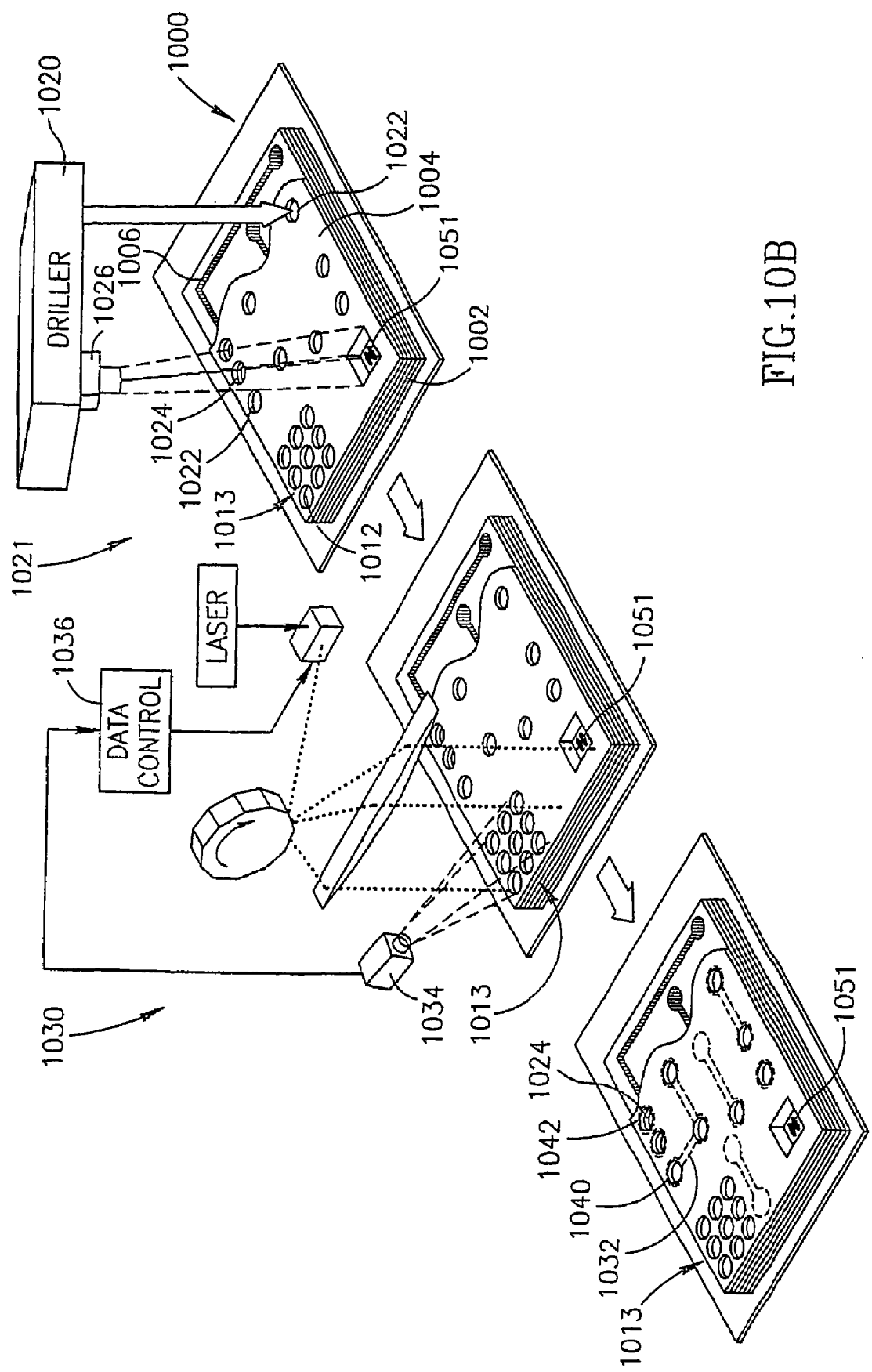
FIG. 10B shows a simplified pictorial illustration of a methodology for manufacturing sequential build up printed circuit boards in accordance with another embodiment of the invention.

Reference is made to FIG. 10A which shows a printed circuit board substrate 1000 formed of a lower layer 1002 and an upper layer 1004 in accordance with an exemplary embodiment of the invention, to FIG. 10B which shows a system for recording an image on a upper layer 1004 with reference to a registration target formed on upper layer in accordance with an exemplary embodiment of the invention, and to FIG. 9C which shows a flow chart for aligning coordinate system of an exposure system with the pattern written on upper layer 1002 in accordance with an exemplary embodiment of the invention.

In FIG. 10A, a portion of the upper layer 1004 is cut away to enable visualization of a pattern 1006 formed on lower layer 1002. It is appreciated that lower layer may be a single layer as shown in FIG. 10A, or a core of a printed circuit board formed of several layers as shown in FIG. 10B. Pattern 1006 forms part of an electrical circuit 1008, which typically includes, inter alia, conductor parts, vias interconnecting between electrical circuit parts on various layers in the electrical circuits, landing pads formed on a lower layer to receive a via, and annular rings surrounding a via on an upper layer.

In the exemplary embodiment shown in FIG. 10A, upper layer 1004 is formed with one or more vias which are aligned with a pattern 1008 formed on lower layer 1002. These via may be of two types, namely connection vias 1010 which are necessary to connect between electrical circuit elements 1008 formed on the lower layer 1002 and electrical circuit elements (not shown) formed on upper layers 1004 respectively, and alignment pattern vias 1012 forming alignment patterns for alignment of the pattern to be written on the upper layer 1004 with the pattern 1006 already formed on the lower layer. Alignment pattern vias 1012 forming an alignment pattern typically are dedicated for use as an alignment pattern and are not otherwise used. Alternatively or additionally, through alignment holes 1024 (FIG. 10B), passing through all of the layers forming printed circuit board substrate 1000, may be provided.

As is well known in the art, the placement of such alignment of holes and vias may be determined, with reference to x-ray images of some or all of the bonded upper and lower layers, or with reference to unveiled alignment targets 1051 (FIG. 10B). The accuracy of placement of vias and through holes is a function of the tolerance of machining apparatus employed to form the vias an through holes. It is appreciated that in exemplary embodiments, the pattern of vias and holes is arranged as described with reference to FIG. 11. Suitable laser drilling systems operative to drill vias with reference to a target are available from Electro Scientific, Inc. of Oregon, U.S.A.

In accordance with an exemplary embodiment of the invention seen in FIG. 10B, a micro-machining device, such as a driller 1020, is provided at a first workstation 1021 to drill micro-via holes 1022 in a substrate 1000 formed of an upper layer 1004 and several lower layers 1002. Substrate 1000 may be provided with through holes 1024, that are drilled either by driller 1020 or other suitable machining apparatus. At least some of the holes formed by driller 1020 are alignment pattern holes 1012 defining a via hole alignment pattern 1013 that is employed in the manufacture of a printed circuit board as described in greater detail hereinbelow. Alignment holes 1012 optionally may be formed over suitable landing pads or copper base (not shown).

It is appreciated that upper layer 1004 is cut away to expose part of a pattern 1006 on the uppermost part of lower layers 1002. Typically, driller 1020 includes a sensor unit 1026, such as a digital camera and suitable image processing circuitry (not shown) operative to image and determine the location of one or more alignment targets, such as an unveiled target 1051. The respective locations of micro-via holes 1022 and through holes 1024 are formed at locations aligned with reference to the location of target 1051.

In a separate step, typically performed at a work station separate from driller 1020, a pattern recording system 1030 is provided to record electrical circuit patterns 1032 on upper surface 1004. In exemplary embodiments of the invention, pattern recording system is a laser direct imaging system such as a DP-100 laser direct imaging system available from Orbotech Ltd. of Yavne, Israel, configured with at least one imager 1034 substantially as described hereinabove with reference to FIGS. 3 & 4.

It is a feature of some exemplary embodiments of the present invention that in system 1030 pattern 1032 is recorded on upper surface 1004 in alignment referenced to via hole alignment pattern 1013, which, being formed by driller 1020, is in precise alignment with other via holes 1022. In some exemplary embodiments, an upper layer alignment target 1052 is recorded on upper surface 1004 to serve as an alignment target for aligning micro-vias in subsequent sequential build up layers of substrate 1000.

As seen in FIG. 10B, system 1030 includes a sensor 1034 which images alignment via hole alignment pattern 1013 and provides location information to a data controller 1036, typically following suitable analysis and computation in computational means as described in greater detail with respect to FIG. 4, which suitably adjusts the location of pattern 1032 on upper surface 1004.

In some exemplary embodiments of the invention, pattern recording system 1030 is operative to dynamically scale pattern data in response to the respective locations of several via hole alignment patterns 1013, as described in PCT patent publication WO 00/02424. It is appreciated that other suitable pattern recording systems, such as conventional steppers and projectors exposing a photosensitive coating through suitable phototools containing an image of a pattern to be recorded, may be employed to record patterns 1032 on substrate 1000 with reference to via hole alignment patterns 1013.

It is noted use of via hole alignment patterns 1013 to align pattern 1032 facilitates the positioning of annular rings concentrically with via holes 1022. Thus although printed circuit board produced using a sequential build-up methodology described with reference to FIG. 10B may exhibit an overall drift, annular rings 1040 in each sequential layer are precisely aligned with micro-vias formed in upper layer 1004, typically to within tolerances that are less than the tolerances which are possible if alignment is referenced to the same target employed to position via holes 1022.

Moreover, it is noted that the tolerances required of annular rings 1042 surrounding through holes typically are larger than the tolerances required of annular rings 1040 surrounding micro-vias 1022. Thus in some exemplary embodiments of the invention, pattern 1032 is aligned to via a hole alignment pattern 1013 (and thus to vias 1022). This typically results in annular rings 1040 being closely concentric with vias 1022, while annular rings 1042 are slightly off center with respect to through holes 1042.

Figure 10C:
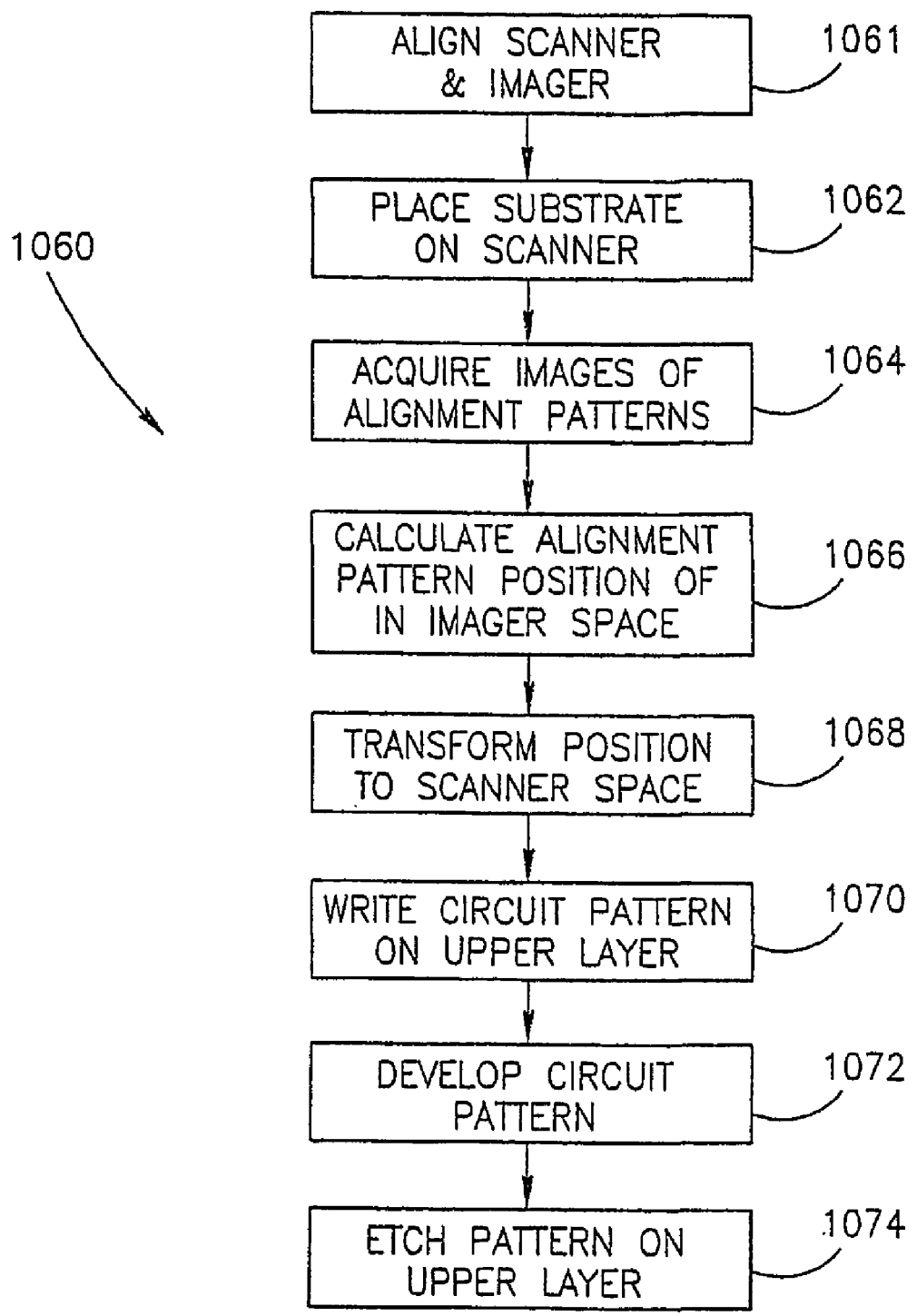
FIG. 10C is a simplified flow diagram of a method of aligning the image to be written on an upper layer with an image already formed on the lower layer for the circuit board of FIG. 10A.

FIG. 10C shows a flow chart (1060) for aligning the scanner coordinate system with the pattern written on the lower layer.

Prior to scanning a batch of electrical circuits, the coordinate space of the imager 202 and of the scanner system are calibrated for example, as described above and with reference to FIGS. 1–8.

A substrate on which an electrical circuit pattern is to be written on an upper layer is placed on the scanner (1062). The substrate is formed so that its surface is coated with a photoresist.

Prior to scanning an electrical circuit pattern onto the substrate, imager coordinate space and scanner coordinate space are aligned (1061) as described hereinabove.

Images of alignment patterns (one or more of the usable vias, the alignment vias or the alignment holes) are acquired (1064), and the position of the alignment patterns in imager coordinate space is calculated (1066). In exemplary embodiments of the invention, using transform data stored in image-scanner transform obtained from a previously performed calibration, for example as described hereinabove with respect to FIGS. 5 and 8, the position of the alignment pattern is transformed to a position in scanner coordinate space (1068).

Once the position of the alignment patterns is known in scanner coordinate space, the substrate may be optionally rotated by the scanner, based on the measurements, as necessary to obtain rotational alignment to the grid pattern of the scanner system. See elements 157, 158 and 160 in FIG. 4. A circuit pattern is written with reference to the position of the alignment patterns in scanner coordinate space (1070). It is noted that multiple alignment patterns may be provided and the pattern written may be scaled with reference to the mutual locations of the patterns. The substrate subsequently is removed from the scanner, the exposed circuit pattern written by the scanner is developed (1072) and etched (1074) to form part of an electrical circuit.

In available hole drilling devices, vias are drilled to provide a best fit to the lower board. However, the holes are drilled in a fixed pattern that does not take into account warping of the pattern written on the lower board as a result, for example, of variable shrinkage of the board during development and etching.

In some embodiments of the present invention, the hole patterns are drilled in positions determined by local features of the lower layer. These features may include alignment patterns especially written onto the lower board. Such patterns may be used to provide an overall shrinkage factor to be applied to the board or to provide a full warping transform to the board. In writing upper board, the data is adjusted either on-the fly or by producing transformed data to fit the image to be written onto the lower image.

Similarly, when the lower layer has a number of alignment patterns that are visible when the upper layer is in place, the plurality of patterns can be used to provide either an overall shrinkage correction (which may be different in the x and y directions) or a full warp correction.

Warp correction of data is well known in the art. The specific methodology of providing such correction in a particular scanner is very dependent on the scanner itself. Thus, such particular methods are not discussed herein. However, application of the methods of the invention is well within the skill of a person of skill in the art.

In some embodiments of the invention the various alignment patterns are offset predetermined distances from edges of the board in order to facilitate determination of which side of the board is facing up, and whether a particular end of the board is its front end or back end. Thus for example, on side A of a board, alignment patterns may be provided along lines that are located 0.5" from the front end of the board and 0.75" from the back end of the board respectively, and along lines that are 0.5" from the right hand side and 0.75" from the left hand side. On side B of the same board, alignment patterns may be provided along lines that are located 0.35" from the front end of the board and 0.6" from the back end of the board respectively, and along lines that are 0.35" from the right hand side and 0.6" from the left hand side. It is appreciated that these values are merely representative and that other suitable unique and differentiable values may be used to distinguish sides and edges. In this manner, it becomes a simple calculation based on distance from an edge to determine whether a given edge is on the front or back side, and whether it is a front, back, left or right edge.

The invention has been described utilizing exemplary apparatus and exemplary methods. It should be understood that other apparatus may be used in carrying out the methods and the methods described may be useful in apparatus that is different from that described. For example, conventional projection exposure systems may be used to record patterns. Furthermore, since each of the methods is, in great measure, a stand alone method, other methods may be utilized in determining one or more of the calibrations described. In particular, it may be possible, under certain circumstances, to delete or simplify one of the calibrations, as for example when the devices are produced to a very high tolerance or where very high accuracy is not needed. In addition, while a system using two imagers has been described, a single imager may be used in one of two ways. In a first embodiment, the imager has a large enough field of view to encompass multiple patterns on the substrate. Generally, this embodiment will have a lower resolution and accuracy, but may be useful for some applications. A second method is to move the imager from position to position to image different patterns. Furthermore, variations in the methods described are also possible.

While the methods and apparatus described represent a "best mode' for carrying out the invention, it should be understood that some elements of the apparatus and claims may not be necessary for all embodiments of the invention and that elements of the various embodiments may be combined.

As used herein, the terms "have", "include" and "comprise" or their conjugates, as used herein mean "including but not necessarily limited to".

The invention claimed is:

1. Apparatus for recording an electrical circuit pattern on an upper layer of a multi-layer printed circuit board substrate, comprising:
an alignment pattern generator generating an alignment pattern that is visible on the upper surface of the multi-layer printed circuit board substrate, said alignment pattern having a known orientation with respect to an electrical circuit pattern formed on one non-upper layer of the substrate, said substrate having at least two layers of circuitry already formed thereon;
an alignment pattern location sensor sensing a location of the alignment pattern; and
an electrical circuit pattern generator recording an electrical circuit pattern on said upper surface in a desired orientation with reference to the alignment pattern.

2. Apparatus for recording an electrical circuit pattern according to claim 1, and wherein said alignment pattern generator is a micro machining device.

3. Apparatus for recording an electrical circuit pattern according to claim 2, and wherein micro machining device is a laser drill.

4. Apparatus for recording an electrical circuit pattern according to claim 2, and wherein said alignment pattern is defined by a plurality of micro-machined holes, and wherein said micro-machined holes do not pass through at least one layer in said multi-layered substrate.

5. Apparatus for recording an electrical circuit pattern according to claim 4, and wherein said plurality of micro-machined holes is arranged in a non-periodic pattern.

6. Apparatus for recording an electrical circuit pattern according to claim 1, and wherein said alignment pattern is defined by a plurality of holes in said upper surface.

7. Apparatus for recording an electrical circuit pattern according to claim 6, and wherein said plurality of holes is arranged in a non-periodic pattern.

8. Apparatus for recording an electrical circuit pattern according to claim 1, and wherein said alignment pattern is defined by a plurality of objects deposited on said upper surface, said objects being arranged in a non-periodic pattern.

9. Apparatus for recording an electrical circuit pattern according to claim 8, and wherein said plurality of objects is a plurality of markings.

10. Apparatus for recording an electrical circuit pattern according to claim 9, and wherein said markings are dimples.

11. Apparatus for recording an electrical circuit pattern according to claim 1, and wherein said an alignment pattern location sensor comprises a digital camera and an image processing circuit operative to acquire an image and compute a location of said alignment pattern.

12. Apparatus for recording an electrical circuit pattern according to claim 11, and wherein said location of said alignment pattern is computed in a coordinate system employed by said electrical circuit pattern generator.

13. Apparatus for recording an electrical circuit pattern according to claim 12, and wherein said upper layer includes a photosensitized surface and said electrical circuit pattern generator is a laser direct imaging scanner selectively recording an electrical circuit pattern on said photosensitized surface.

14. Apparatus for recording an electrical circuit pattern according to claim 12, and wherein said upper layer includes a photosensitized surface and said electrical circuit pattern generator comprises a phototool mask and a light projector projecting light through said phototool mask onto said photosensitized surface to selectively record an electrical circuit pattern thereon.

15. Apparatus for aligning a first electrical circuit pattern to be recorded on an upper layer of a multi-layer printed circuit board substrate to a second electrical circuit pattern formed on a lower layer of the multi-layer printed circuit board substrate, comprising:
an alignment pattern location sensor sensing a location of an alignment pattern located on a multi-layered printed circuit board substrate including at least said upper layer connected to a lower layer, said second electrical circuit pattern being formed on said lower layer, said alignment pattern having a known orientation to said second electrical circuit pattern; and
an electrical circuit pattern generator recording an electrical circuit pattern on said upper surface in a desired orientation with reference to the alignment pattern.

16. Apparatus for recording an electrical circuit pattern according to claim 15, and wherein said alignment pattern is disposed along said upper layer.

17. Apparatus for recording an electrical circuit pattern according to claim 16, and wherein said alignment pattern is defined by a plurality of holes in said upper surface.

18. Apparatus for recording an electrical circuit pattern according to claim 17, and wherein said plurality of holes is arranged in a non-periodic pattern.

19. Apparatus for recording an electrical circuit pattern according to claim 17, and wherein said plurality of holes do not pass through said lower layer.

20. Apparatus for recording an electrical circuit pattern according to claim 15, and wherein said alignment pattern is defined by a plurality of holes through said multi-layered printed circuit board substrate.

21. Apparatus for recording an electrical circuit pattern according to claim 20, and wherein said plurality of holes is arranged in a non-periodic pattern.

22. Apparatus for recording an electrical circuit pattern according to claim 15, and wherein said alignment pattern is defined by a plurality of visible objects deposited on said upper surface, said visible objects being arranged in a non-periodic pattern.

23. Apparatus for recording an electrical circuit pattern according to claim 22, and wherein said plurality of visible objects is a plurality of markings.

24. Apparatus for recording an electrical circuit pattern according to claim 23, and wherein said markings are dimples.

25. Apparatus for recording an electrical circuit pattern according to claim 15, and wherein said an alignment pattern location sensor comprises a digital camera and image processing circuitry operative to acquire an image and compute a location of said alignment pattern.

26. Apparatus for recording an electrical circuit pattern according to claim 25, and wherein said location of said alignment pattern is computed in a coordinate system employed by said electrical circuit pattern generator.

27. Apparatus for recording an electrical circuit pattern according to claim 26, and wherein said upper layer includes a photosensitized surface and said electrical circuit pattern generator is a laser direct imaging scanner selectively recording an electrical circuit pattern on said photosensitized surface.

28. Apparatus for recording an electrical circuit pattern according to claim 26, and wherein said upper layer includes a photosensitized surface and said electrical circuit pattern generator comprises a phototool mask and a light projector projecting light through said phototool mask onto said photosensitized surface to selectively record an electrical circuit pattern thereon.

* * * * *